United States Patent
Lathrop et al.

(10) Patent No.: US 11,816,558 B2
(45) Date of Patent: Nov. 14, 2023

(54) INTEGRATED CIRCUIT DESIGNS FOR RESERVOIR COMPUTING AND MACHINE LEARNING

(71) Applicant: UNIVERSITY OF MARYLAND, COLLEGE PARK, College Park, MD (US)

(72) Inventors: Daniel Lathrop, University Park, MD (US); Itamar Shani, Rockville, MD (US); Peter Megson, Washington, DC (US); Alessandro Restelli, Greenbelt, MD (US); Anthony Robert Mautino, Damascus, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 763 days.

(21) Appl. No.: 16/613,990

(22) PCT Filed: May 16, 2018

(86) PCT No.: PCT/US2018/032902
§ 371 (c)(1),
(2) Date: Nov. 15, 2019

(87) PCT Pub. No.: WO2018/213399
PCT Pub. Date: Nov. 22, 2018

(65) Prior Publication Data
US 2021/0406648 A1    Dec. 30, 2021

Related U.S. Application Data

(60) Provisional application No. 62/662,119, filed on Apr. 24, 2018, provisional application No. 62/555,511, (Continued)

(51) Int. Cl.
*G06N 5/00*    (2023.01)
*G06N 7/00*    (2023.01)
(Continued)

(52) U.S. Cl.
CPC ............... *G06N 3/063* (2013.01); *G06N 3/08* (2013.01); *G06N 3/044* (2023.01)

(58) Field of Classification Search
CPC ............ G06N 5/00; G06N 7/00; G06N 10/00; G06N 3/08; G06N 3/063; G06N 3/0445
(Continued)

(56) References Cited

U.S. PATENT DOCUMENTS

| | | | |
|---|---|---|---|
| 5,778,152 A * | 7/1998 | Oki ........................ | G06N 3/08 706/31 |
| 7,516,111 B2 * | 4/2009 | Samson ................ | G06Q 30/02 706/45 |

(Continued)

OTHER PUBLICATIONS

Lukosevicius M et al_ Reservoir Computing Trends—Künstl Intell (2012).
(Continued)

*Primary Examiner* — Daquan Zhao
(74) *Attorney, Agent, or Firm* — QUARLES & BRADY LLP

(57) ABSTRACT

An integrated circuit device for reservoir computing can include a weighted input layer, an unweighted, asynchronous, internal recurrent neural network made up of nodes having binary weighting, and a weighted output layer. Weighting of output signals can be performed using predetermined weighted sums stored in memory. Application specific integrated circuit (ASIC) embodiments may include programmable nodes. Characteristics of the reservoir of the device can be tunable to perform rapid processing and pattern recognition of signals at relatively large rates.

20 Claims, 23 Drawing Sheets

Related U.S. Application Data filed on Sep. 7, 2017, provisional application No. 62/506,951, filed on May 16, 2017.

(51) Int. Cl.
*G06N 10/00* (2022.01)
*G06N 3/08* (2023.01)
*G06N 3/063* (2023.01)
*G06N 3/044* (2023.01)

(58) Field of Classification Search
USPC ...... 706/33, 57, 1, 2, 4, 5, 6, 13, 15, 16, 27, 706/45
See application file for complete search history.

(56) References Cited

U.S. PATENT DOCUMENTS

| | | | |
|---|---|---|---|
| 8,560,282 | B2 | 10/2013 | Macready et al. |
| 2009/0043722 | A1 | 2/2009 | Nugent |
| 2012/0054131 | A1* | 3/2012 | Williamson ........... G06N 20/00 706/12 |
| 2014/0214738 | A1 | 7/2014 | Pickett |
| 2015/0009548 | A1 | 1/2015 | Bienstman et al. |
| 2017/0103321 | A1* | 4/2017 | Henry ................. G06F 7/49947 |

OTHER PUBLICATIONS

Triefenbach F et al_Phoneme Recognition with Large Hierarchical Reservoirs_NeurIPS Proceedings (2010).

Ilies, Iulian, et al. Stepping forward through echoes of the past: forecasting with echo state networks. (2007).

Antonelo EA et al, Event detection and localization for small mobile robots using reservoir computing, Neural Networks 21:862-871 (2008).

Jaeger & Haas Harnessing Nonlinearity: Predicting Chaotic Systems and Saving Energy in Wireless Communication, Science 304 (2004).

Jaeger H, The 'echo state' approach to analysing and training recurrent neural networks (2010).

ISR of Priority Application PCT/US2018/032902 (Aug. 2018).

Written Opinion of Priority Application PCT/US2018/032902 (dated Aug. 2018).

IPRR of Priority Application PCT/US2018/032902 (Nov. 2019).

\* cited by examiner

INTEGRATED CIRCUIT DESIGNS FOR RESERVOIR COMPUTING AND MACHINE LEARNING

CROSS-REFERENCE TO RELATED APPLICATIONS

This application claims the benefit of U.S. Provisional Application No. 62/662,119, filed on 2018 Apr. 24; U.S. Provisional Application No. 62/555,511 filed on 2017 Sep. 7, and U.S. Provisional Application No. 62/506,951, filed on 2017 May 16.

STATEMENT REGARDING FEDERALLY SPONSORED RESEARCH OR DEVELOPMENT

This invention was made with government support under EAR1417148 awarded by the NSF. The government has certain rights in the invention.

BACKGROUND

Digital microprocessors are commonly used to simulate artificial neural networks for certain pattern recognition and machine learning tasks. In such artificial neural networks, the connection weights between nodes internal to the artificial neural network can be optimized to transform certain classes of input signals into desired output signals. However, these computations are generally limited in processing speed and are energy intensive.

Field programmable gate arrays (FPGAs) and application specific integrated circuits (ASICs) designed to perform machine learning tasks increase processing speed and moderately reduce energy costs by tailoring the circuitry to perform the specifically required tasks and by parallelizing the computations. However these systems are generally limited in speed as they rely on clocked digital computations.

DETAILED DESCRIPTION

Unclocked, asynchronous computation, such as may be performed in reservoir computing, can result in increased noise volatility on input signals, which is not generally viewed as beneficial for many conventional applications. However, for performing machine learning and other pattern recognition tasks, noise volatility on input signals can lead, for example, as in dropout regularization, to advantages such as better generalization of applicable tasks.

Embodiments of this disclosure can include a device that implements techniques for reservoir computing in an integrated circuit to allow for rapid processing and pattern recognition of signals at relatively large rates. Hardware implementations of reservoir computing, such as those disclosed herein, can be used for machine learning tasks such as pattern recognition, classification, prediction, mimicking, and control. For example, implementations of this disclosure can perform speech recognition, financial forecasting, chaotic time series prediction, and robot control. Significant power savings can be realized by embodiments of this disclosure. For example, embodiments of a device as described in this disclosure can perform between about 20 to about 500 tera operations per second (TOPS) at about 6 TOPS/watt (W), where an operation can be an asynchronous analog voltage change at the output of one node.

Embodiments of this disclosure can include a device having a reservoir, which may be a recurrent artificial neural network of many interconnected artificial neurons or nodes implemented in integrated circuitry, such as an FPGA or ASIC. Tuning the processing dynamics of the reservoir can improve the performance of the device at certain machine learning tasks. The processing dynamics of the reservoir can be tuned by adjusting characteristics of the reservoir, such as the type of operations performed by the nodes in the reservoir, voltage levels supplied to particular nodes or the overall reservoir, and parameters of the distribution of interconnections among the nodes. The reservoir nodes can have binary weighting based on the interconnections. For example, a reservoir node can have a weight of "1" with respect to another reservoir node if it is coupled to the other reservoir node or a weight of "0" with respect to the other node if it is not. Signals from the input layers and/or to the output layers of the device can be weighted based on training of the device. Signals transmitted to the output layer can be weighted based on weighted sums that are determined in training, stored in memory, and associated with node states from output signals from the reservoir.

Reservoir Computing

Figure 1:
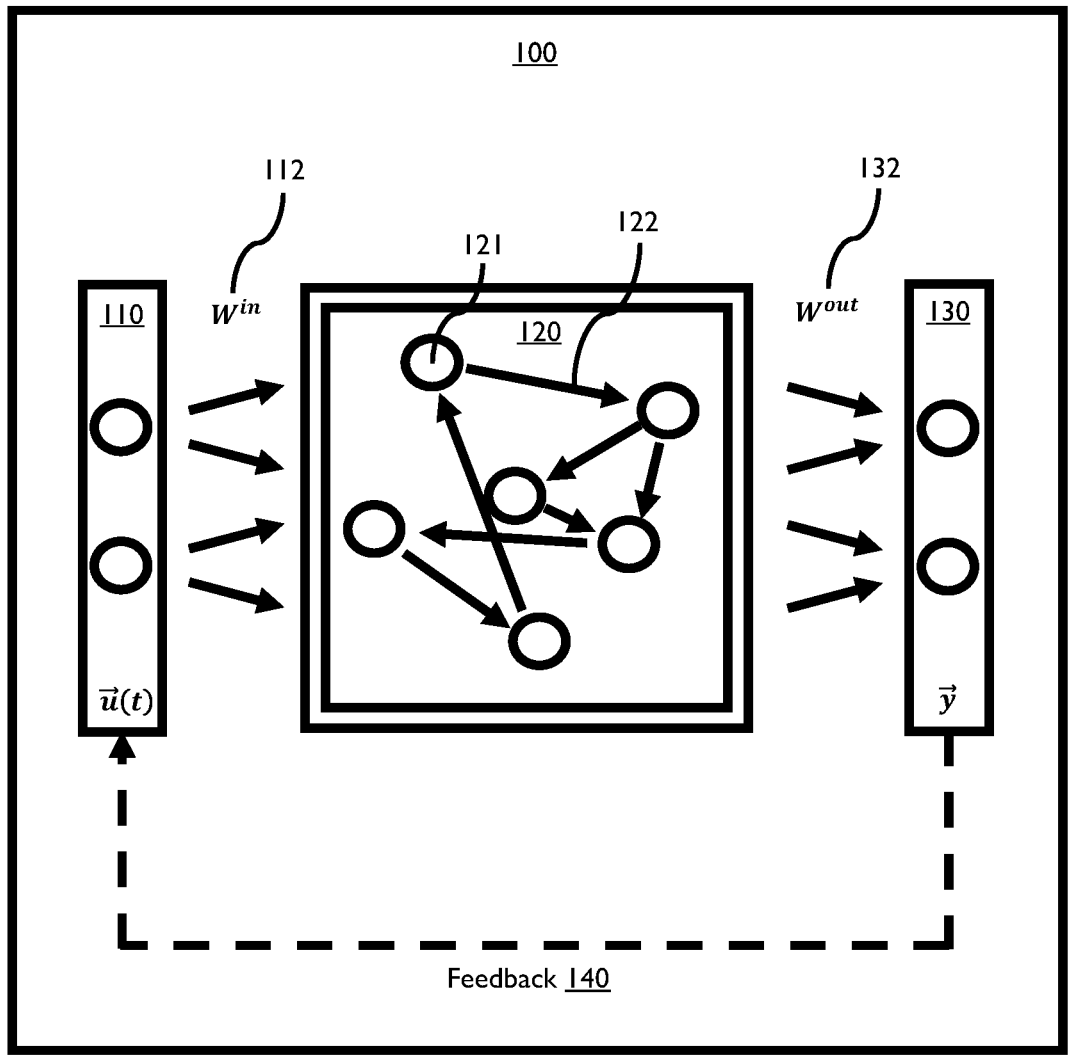
FIG. 1 shows a block diagram for an example device for reservoir computing according to embodiments of this disclosure.

Embodiments of reservoir computing according to this disclosure can include a device having an input layer, input-processing components, an internal network having a reservoir, output-processing components, and an output layer embodied in an integrated circuit. FIG. 1 shows a block diagram of an example device 100 for reservoir computing, according to embodiments of this disclosure. The input layer 110 can include a set of one or more input channels that may be parallel. The input layer 110 may carry external analog or digital input signals $\vec{u}(t)$ to internal network 120 via input-processing components that can apply input weights $W^{in}$ 112 to the input signals. In some embodiments, input-processing components can operate on input signals before the input signals are provided to input layer 110. Input-processing components of the device 100 coupled to the input layer, such as a digital-to-analog converter (DAC) or an analog to digital converter (ADC) can convert digital input signals to an analog input signals and vice versa. For example, a DAC can convert digital input signals to analog input signals before passing the input signals to other input-processing components and/or the internal network 120. Input layer 110 and/or input-processing components can be clocked and synchronous components of device 100

The input signals $\vec{u}(t)$ can be weighted before passing to the internal network 120 using values determined during training of the device 100, according to embodiments of this disclosure. For example an input-processing component of the device 100 may apply weights $W^{in}$ 112 to input signals $\vec{u}(t)$ from input channels in input layer 110 before passing the input signals to internal network 120. The set of input channels of input layer 110 can be directly coupled to internal network 120 or indirectly coupled to internal network 120 via input-processing components. Input layer 110 can be coupled to input nodes of the reservoir of internal network 120. Input nodes in the reservoir may be a subset of all nodes 121 in the reservoir and may receive external input signals to the reservoir. Output nodes of nodes 121 in the reservoir may be a subset of all nodes 121 in the reservoir and may provide output signals from the reservoir. In embodiments of this disclosure, a subset of nodes may include less than or all of the nodes of the set of nodes of which it is a subset.

The internal network 120 can include a reservoir, which may be a recurrent artificial neural network of many interconnected artificial neurons or nodes 121. The internal network 120 can include a set of interconnections 122, each of which can couple the output of a node in the reservoir to the input of another node in the reservoir. In embodiments of this disclosure, the set of interconnections 122 in the reservoir can be distributed among nodes 121 in accordance with a selected distribution. The connectivity among nodes 121 depicted in FIG. 1 is exemplary only, and this disclosure contemplates any other arrangement of interconnections 122 among nodes 121 that is suitable for the purpose of this disclosure. The reservoir nodes 121 can have binary weighting based on interconnections. For example, a reservoir node can have a weight of "1" with respect to another reservoir node if it is coupled to the other reservoir node or a weight of "0" with respect to the other node if it is not. The nodes 121 in the reservoir may implement one or more logic gates, such as Boolean logic gates that perform non-linear operations, such as the alternative denial operation (NAND), on a set of input signals and pass the result of the function as an output signal to other nodes 121 in the reservoir and/or directly or indirectly to the output layer 130. An input signal to any node 121 in the reservoir can be a combination of output signals of one or more other nodes 121 in the reservoir and/or external input signals. Some or all nodes 121 in the reservoir can send output signals directly or indirectly, such as via output-processing components, to the output layer 130.

The reservoir of the internal network 120 may operate unclocked and without registers, and thus signals can propagate among the nodes in the reservoir in a parallel, asynchronous manner, according to embodiments of this disclosure. Electric voltages within the reservoir can take on a continuous range of values between the voltage values that correspond to the Boolean "0" and Boolean "1" of the circuits for the logic gates of the reservoir nodes 121. Thus each reservoir node 121 can perform a type of non-linear operation on the node's input signals to generate an output signal for the node 121. Transitional voltages and circuit timing within the reservoir can carry information useful for machine learning tasks, such as pattern recognition.

It can be beneficial to configure the processing dynamics of the reservoir depending on the particular processing task, according to embodiments of this disclosure. The processing dynamics of the reservoir can be tuned, for example, by adjusting the type of operations performed by the reservoir nodes 121, power supply voltages supplied to particular nodes 121 or the overall set of nodes 121 in the reservoir, and/or parameters of the distribution of interconnections among the nodes 121. Tuning the reservoir can improve the performance of the device 100 at certain machine learning tasks.

Output nodes of the reservoir may be directly coupled to output channels of output layer 130 or indirectly coupled to output channels of output layer 130, such as via output-processing components. For example an output-processing component of the device 100 may receive output signals from output nodes of the reservoir and apply weights $W^{out}$ 132 to the output signals before passing them on to output channels of output layer 130. The output signals can be weighted using values $W^{out}$ 132 determined during training of the device 100.

Device 100 may include output-processing components such as a set of one or more weighting units that are each coupled to a memory unit of the device 100, according to embodiments of this disclosure. Each weighting unit can be coupled to a particular subset of output nodes. Each different combination of output signals carried from the particular set of output nodes can represent a different node state for the particular subset of output nodes. In training of the device 100, weighted sums or non-linear activations of the weighted sums can be determined for each particular node state and stored in a memory unit of device 100. Each predetermined weighted sum can be linked with the node state that served as the basis for its determination such that the particular node state serves as an address for the predetermined weighted sum. In this way, for example, a weighting unit can select a weighted sum based on a particular node state. The predetermined weighted sums and their linked addresses can be stored in the memory unit on the device 100.

A summing unit of the device 100 coupled to two or more weighting units can sum the weighted sums output from each of the weighting units and output a sum of the weighted sums, according to an embodiment of this disclosure. This sum of the weighted sums can be passed to other output-processing components of device 100 or the output channels of output layer 130 as the output signal $\vec{y}$ for the device 100. Other output-processing components of the device 100 coupled to the output layer 130, such as ADCs or DACs, can convert the analog output signals to digital output signals and vice versa. For example, an ADC can convert analog output signals to digital output signals before passing the output signals to other components of the device 100, such as output layer 130. Implementations of this disclosure can include other techniques for weighting output signals from the output layer, and such techniques are discussed in later portions of this disclosure.

The output layer 130 can include a set of one or more output channels that receive output signals signal $\vec{y}$ directly or indirectly from output nodes of internal network 120, according to embodiments of this disclosure. The output signals carried by the output layer 130 can be a linear combination of the output of all the nodes 121 in the reservoir. Output layer 130 and/or output-processing components can be clocked and synchronous components of device 100.

Integrated Circuits

Figure 2:
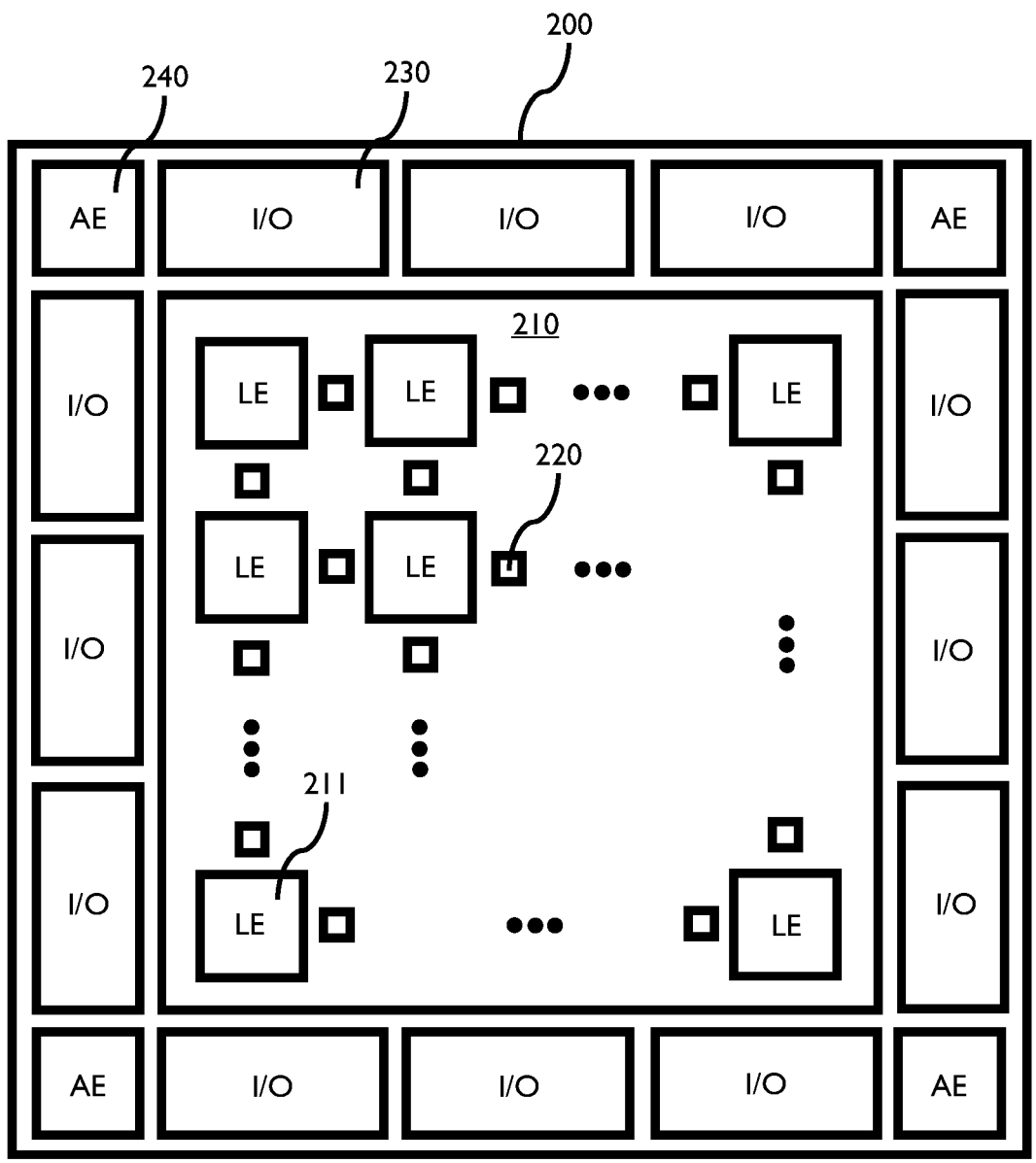
FIG. 2 shows a block diagram of an example integrated circuit according to embodiments of this disclosure.

Reservoir computing may be implemented on any type or combination of integrated circuitry suitable for the purposes of this disclosure. FIG. 2 shows a block diagram of an example integrated circuit according to embodiments of this disclosure. Integrated circuits suitable for the purposes of this disclosure may include FPGAs, ASICs, systems on a chip, and other suitable integrated circuitry discussed herein.

Device 100 can be implemented in integrated circuitry, such as integrated circuit 200 shown in FIG. 2, according to embodiments of this disclosure. Generally, an integrated circuit, such as integrated circuit 200, can include elements such as core logic region 210, interconnections 220, and high-speed input/output elements 230. Integrated circuit 200 can include additional elements 240 at locations on integrated circuit 200 such as adjacent to input/output elements 230. Additional elements can include, for example, phase-locked loops for clock generation and timing, register circuits, and memory circuits.

Core logic region 210 may be populated with logic cells that include logic elements 211, among other circuits. Logic elements 211 may include regions, such as look-up table-based logic regions and may be grouped into logic blocks. In some embodiments, such as FPGA implementations, logic elements 211 and logic blocks can be configured to perform logical functions desired by a user. In embodiments such as FPGA devices, configuration data loaded into configuration memory may be used to produce control signals that configure logic elements 211 and logic array blocks to perform the desired logical functions. In embodiments such as ASIC devices, desired logical functions may be hardwired into integrated circuit 200. Control functions in such ASIC devices may be performed, for example, by a microprocessor coupled to the ASIC device.

Signals received from external circuitry at input/output elements 230 may be routed via interconnections 220 from input/output elements 230 to core logic region 210 and logic elements 211 in integrated circuit 200. Interconnections 220 can include any substance suitable for connecting elements of integrated circuit 200, such as copper, polysilicon, and/or aluminum wires. Interconnections 220 can connect two or more elements of integrated circuit 200 in any combination suitable for the purposes of this disclosure. In embodiments, such as FPGA devices, configuration data loaded into configuration memory may be used to produce control signals that configure interconnections 220 to perform desired logical functions. Logic elements 211, interconnections 220, and other elements of integrated circuit 200 may accordingly be connected to perform functions based on the signals received. In embodiments, such as ASIC devices, desired logical functions may be hardwired into integrated circuit 200.

Signals may be sent from core logic region 210 and other relevant elements of integrated circuit 200 to other external circuitry or components that may be connected to integrated circuit 200 through input/output elements 230. A single integrated circuit device such as integrated circuit 200 can support a variety of different interfaces, and each individual input/output element 230 can support a different input/output standard with a different interface or protocol, such as a high-speed serial interface protocol.

Input/output elements 230 may include input/output buffers and high-speed transceiver circuitry that connect integrated circuit 200 to other external components. Generally, transceiver circuitry may include transmitter and receiver circuits that communicate with external components via different interfaces. In one example, transceiver circuitry in integrated circuit 200 may receive, process, and transmit image sequences or video streams at different resolutions and data rates.

The specific quantities and locations of core logic region 210, logic elements 211, interconnections 220, input/output elements 230, and additional elements 240 of integrated circuit 200 show in FIG. 2 are illustrated for exemplary purposes only. Embodiments of this disclosure may include some or all of the elements shown in FIG. 2, and the elements shown in FIG. 2 may have different quantities and/or locations from those shown. Other elements and components not depicted in FIG. 2 may also be included in embodiments of this disclosure.

Input Layer and Input-Processing Components

Devices for reservoir computing may operate on analog signals and mixed digital and analog signals, according to embodiments of this disclosure. For example, the reservoir of internal network 120 can be configured to operate on digital signals, in which case device 100 may directly send digital source data to internal network 120, subject to any weighting or formatting performed by input-processing components. If the source data in such an example is in analog format, device 100 can convert the analog source data to digital format before providing to internal network 120. As another example, the reservoir of internal network 120 can be configured to operate on analog signals, in which case device 100 can convert the digital source data to analog format before providing to internal network 120. If the source data in such an example is in analog format, device 100 can send the source data directly to internal network 120, subject to any weighting or formatting.

Figure 3:
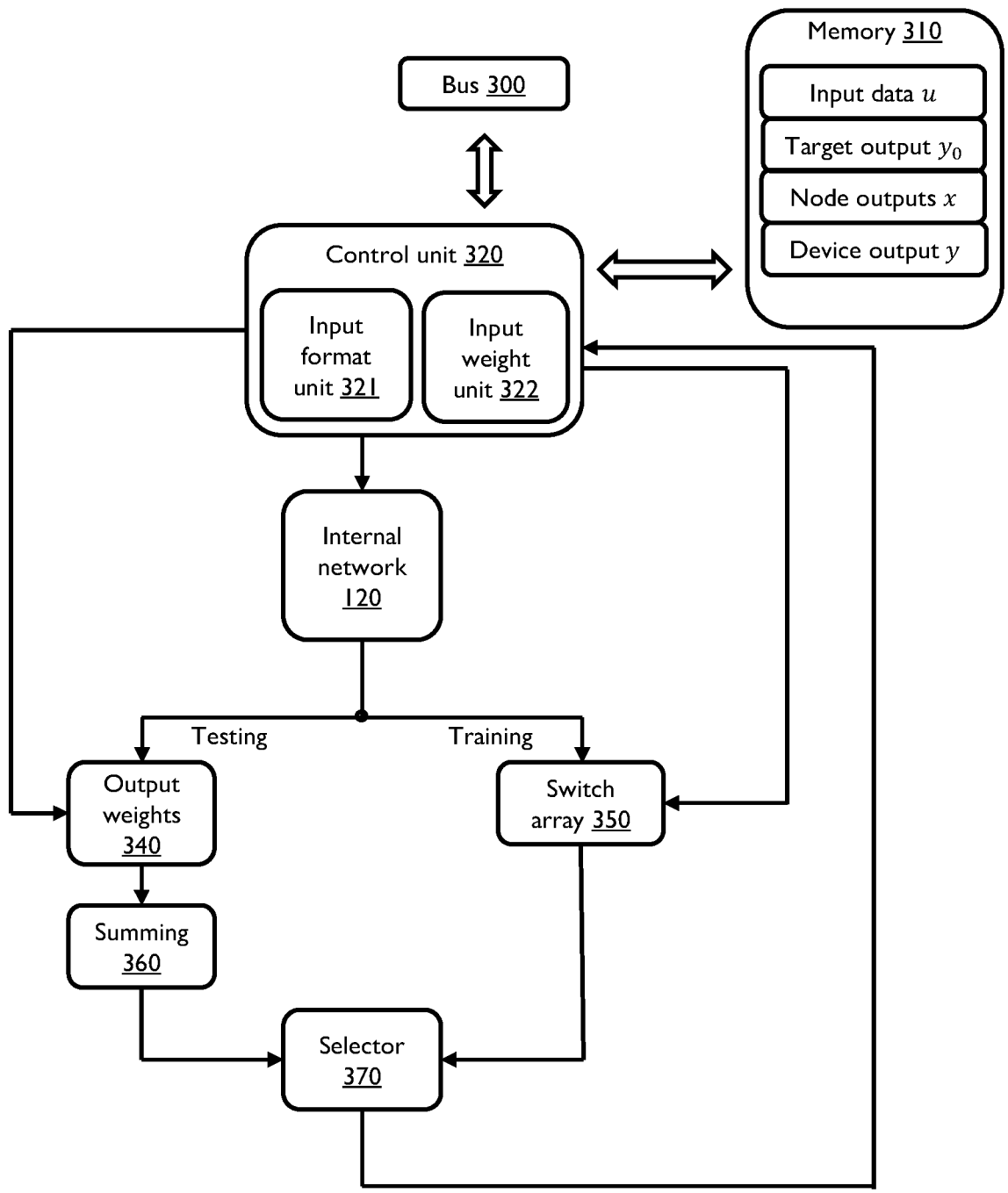
FIG. 3 shows a block diagram of an example device for reservoir computing having digital reservoir inputs according to embodiments of this disclosure.

FIG. 3 shows a block diagram of an example device for reservoir computing having digital reservoir inputs according to embodiments of this disclosure. Device 100 can load input signals, such as input data $\vec{u}(t)=(u_1(t), u_2(t), \ldots, u_K(t))$, to memory 310 from a host computing device in communication with device 100. During training or other operations of device 100, control unit 320 can load target output $y_0$, node outputs x, and device output y to memory 310. The host computing device can be any computing device suitable for the purposes of this disclosure, such as any suitable computing device discussed below in reference to FIG. 22. The host computing device may be directly in communication with device 100 or indirectly connected, such as in accordance with any suitable components of the network arrangement depicted below in FIG. 23. Memory 310 can be any memory circuitry suitable for the purposes of this disclosure, such as random access memory (RAM), or other suitable memory types discussed below with respect to FIG. 22. Memory 310 may be integrated on device 100. Control unit 320 can manage data transfer onto memory 310 through communication bus 300. Communications bus 300 can be any bus device suitable for the purposes of this disclosure, such as a device that operates in accordance with the peripheral component interconnect express (PCIe) standards.

In some embodiments, device 100 may not be in communication with a host computing device. For example, in some embodiments control unit 320 can load input data $\vec{u}(t)$ to memory 310 from input sensors, actuators, or other input sources other than a computing device. Some or all of the components shown in FIG. 3 can be integrated on device 100. For example, device 100 can include an integrated circuit such as an FPGA, and each component shown in FIG. 3 can be implemented in configurable logic of the FPGA, such as is described above with respect to FIG. 2. In another example, device 100 can include an ASIC having a microcontroller, and the microcontroller can function as control unit 320.

In digital input embodiments of this disclosure, control unit 320 may include circuitry for input-processing components, such as input format unit 321 and input weight unit 322. Input weight unit 322 can apply weighting to input data $\vec{u}(t)$ received from input channels of input layer 110. In some embodiments, input weight unit 322 of control unit 320 can be coupled to input layer 110. Input layer 110 may include a set of input channels, such as parallel input channels, that carry digital input signals. Input data $\vec{u}(t)$ can include, for example, input signals $u_k(t)$ (k=K). Input weight unit 322 can apply weights to input signals $u_k(t)$ by, for example, multiplying input signals $u_k(t)$ by weights $W^{in}$ 112. For example, input weight unit 322 can multiply input signals $u_k(t)$ by $N_{in}$ different input weights $W_{k,n}^{in}$ to produce a set of $K \times N_{in}$ weighted input signals $u_{k,n} = u_k W_{k,n}^{in}$ (n=1 ... $N_{in}$). In some implementations, the weights $W_{k,n}^{in}$ can be set when initializing the device 100 and can be restricted from changing during training, testing, and/or other operations of device 100. Control unit 320 can provide the weighted input data $\vec{u}(t)$ to processed input channels that interface directly or indirectly with input components of internal network 120. For example, control unit 320 can transfer the $K \times N_{in}$ parallel input signals $u_{k,n}$ via processed input channels to a bank of input lines of internal network 120. In some embodiments, input-processing components, such as input weighting unit 322 can operate on input signals before the input signals are provided to input layer 110, and input layer 110 can provide the processed input signals directly to internal network 120.

As discussed in other portions of this disclosure, internal network 120 can implement a reservoir for processing input signals $u_{k,n}$ and provide output signals from the reservoir. Output-processing components, such as weighting unit 340 can apply weighting to reservoir output signals and summing unit 360 can sum the weighted reservoir output signals. Selector 370 can select the summed weighted reservoir output signals and provide the signals to control unit 320 where the signals can be used as the output signal $\vec{y}$ of device 100. Switch array 350 can be employed in training of internal network 120. Later portions of this disclosure provide further discussion of weighting, summing, and training of reservoir output signals, as well as other operations and components of embodiments of this disclosure.

Figure 4:
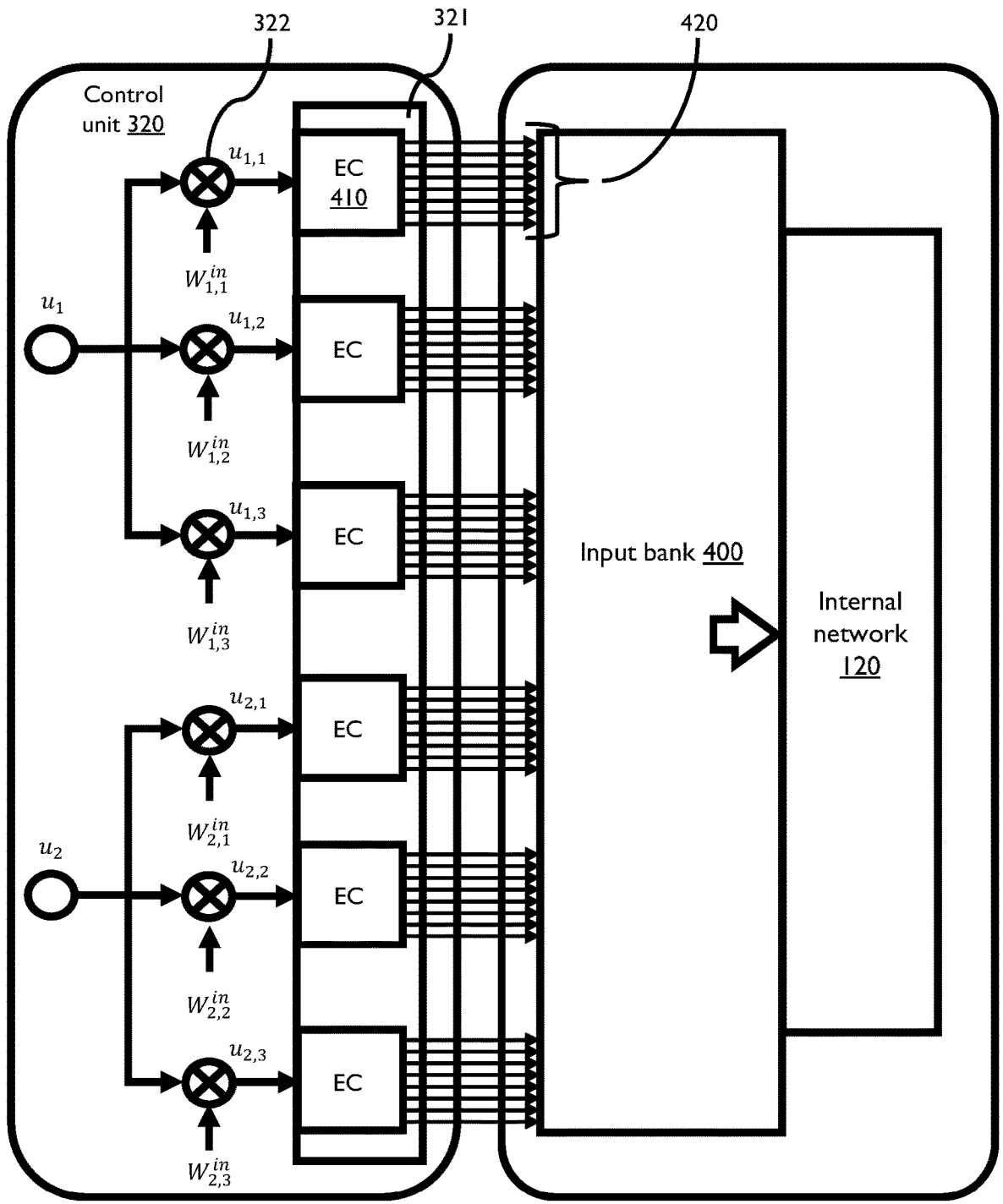
FIG. 4 shows a block diagram of example circuitry for digital input weighting and encoding according to embodiments of this disclosure.

A variety of input-processing components can perform input signal weighting, formatting, and encoding operations in accordance with digital reservoir input weighting embodiments of this disclosure. FIG. 4 shows a block diagram of example circuitry for digital reservoir input weighting and encoding according to embodiments of this disclosure. As discussed above, input weighting unit 322 of control unit 320 can apply input weights to input data $\vec{u}(t)$. Input format unit 321 of control unit 320 can process input data $\vec{u}(t)$ into a format suitable for internal network 120. For example, input format unit 321 can include circuitry, such as encoding converters 410 for formatting input data $\vec{u}(t)$. Encoding converters 410 can process input data $\vec{u}(t)$ into a multichannel digital waveform over processed input channels 420 and provide the waveform to input bank 400. Input bank 400 can connect directly to input nodes of the reservoir in internal network 120.

Implementations of this disclosure may employ any digital encoding technique suitable for the purposes of this disclosure. As shown in FIG. 4, formatting and/or encoding of the digital input $u_k(t)$ may be done within the control unit 320 and the control unit 320 may be directly coupled or indirectly coupled to the inputs of the internal network 120. Encoding techniques suitable for the purposes of this disclosure may include, for example, binary, Gray coding (reflected binary code), one-hot (single bit is high), and thermal encoding. In implementations of this disclosure, each input signal $u_k(t)$ (k=1, ..., K) can be digitally encoded by encoding converters 410 and represented by $N_{in}$ digital input signals $u_{k,n}$ (n=1 ... $N_{in}$) over processed input channels 420. Input layer 110 in can include $K \times N_{in}$ parallel processed input channels 420. Each digital input signal can carry one bit of information per clock cycle of the input layer 110, according to implementations of this disclosure.

In implementations of this disclosure, encoding converters 410 may employ thermal encoding to encode values, such as continuously varying real numbers. In thermal encoding the number of differing encoded bits can be proportional to the difference in encoded real numbers. For example, to encode a real value x, channels 1 through X ($X \leq N_{in}$) can have value "1" and channels X+1 through $N_{in}$ can have value "0." The value of X can be proportional to x. This encoding can be beneficial for real number encoding because two similar values of $u_k$ can be represented by similar values of the $N_{in}$ encoded bits, while two largely differing values of $u_k$ can be represented by a large number of differing encoded bits. This gradual change in the values of the digital channels can be beneficial in implementations of this disclosure because it may result in a response of the reservoir of internal network 120 that gradually changes as the values over processed input channels 420 change. In some implementations, Gray code can have an advantage over thermal encoding because it can allow the encoding of a number of levels exponentially larger as the number of bits increases, while in thermal encoding, the number of levels can be linearly proportional to the number of bits. In some circumstances techniques employing Gray code may result in a number of differing bits that may not be proportional to the difference in encoded values.

Input-processing components, such as those implemented by control unit 320 can be coupled via processed input channels 420 to the inputs of input nodes of internal network 120 via input bank 400, according to embodiments of this disclosure. In some embodiments, each processed input channel can be coupled to one or more nodes 121 of the reservoir of internal network 120, and each node 121 in internal network 120 can receive zero, one, or more different processed input channels 420. In some embodiments, input channels of input layer 110 may be coupled directly to one or more nodes 121 of internal network 120 in accordance with a similar coupling arrangement. Later portions of this disclosure provide further discussion of the reservoir of internal network 120 as well as other components of digital and/or analog input embodiments of this disclosure.

Figure 5:
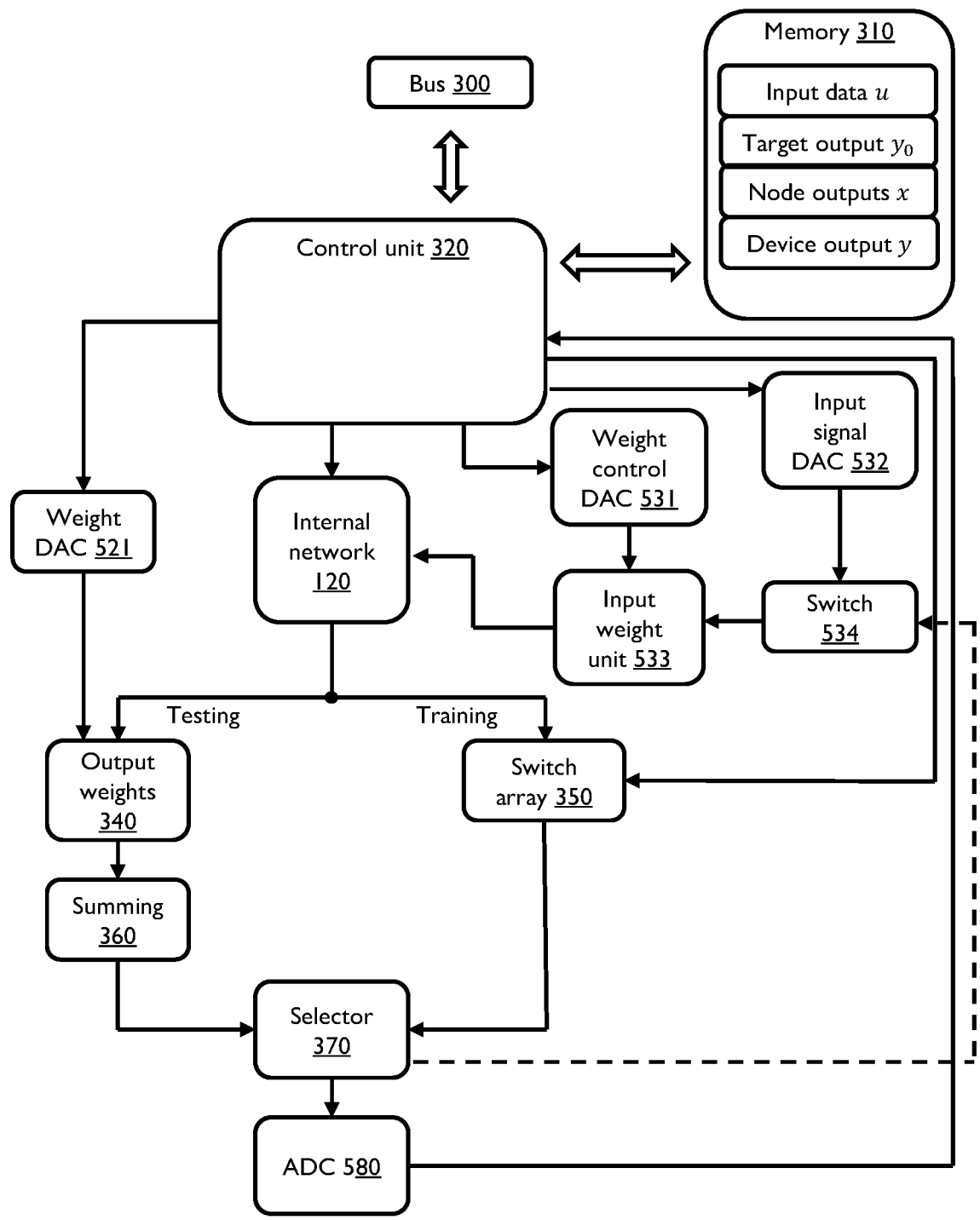
FIG. 5 shows a block diagram of an example device for reservoir computing having analog reservoir inputs according to embodiments of this disclosure.

As discussed above, in some embodiments of this disclosure, the format of source data may differ from the input format of the reservoir of internal network 120. FIG. 5 shows a block diagram of an example device for reservoir computing having analog reservoir inputs according to embodiments of this disclosure. Control unit 320 can load input signals received from input layer 110, such as digital input data $\vec{u}(t)=(u_1(t), u_2(t), \ldots, u_K(t))$ to memory 310. The input data $\vec{u}(t)$ may be received from a host computing device or other data source in communication with device 100. In some implementations, a host computing device may load input signals directly to memory 310 and independent of control unit 320. Control unit 320 may provide digital input data $\vec{u}(t)$ from memory 310 to input signal DAC 532. Input signal DAC 532 can convert digital input data $\vec{u}(t)$ to analog input data $\vec{u}(t)$, such as a multi-channel analog waveform. Switch 534 may connect input signal DAC 532 to input weight unit 533.

In some embodiments, input-processing components, such as input weight unit 533 may include hardwired input weights $W^{in}$ 112, in which case input weight unit 533 can apply hardwired input weights $W^{in}$ 112 directly to analog input data $\vec{u}(t)$. In other embodiments, control unit 320 can control weight control DAC 531 to set input weights $W^{in}$ 112 and apply input weights $W^{in}$ 112 to analog input data $\vec{u}(t)$. Input weight unit 533 can provide weighted, analog input data $\vec{u}(t)$ to internal network 120.

As discussed throughout this disclosure, internal network 120 can implement a reservoir for processing input signals $\vec{u}(t)$ and provide output signals from the reservoir. Output-processing components, such as output weighting unit 340 can apply weighting to reservoir output signals and summing unit 360 can sum the weighted reservoir output signals. Selector 370 can select the summed weighted reservoir output signals and provide the signals to ADC 580, which can convert the summed weighted output signal to a digital format suitable for control unit 320. ADC 580 can provide the summed weighted reservoir output signals to control unit 320 where the signals can be used as the output signal of device 100. Switch array 350 and weight DAC 521 can be employed in training of internal network 120. Later portions of this disclosure provide further discussion of weighting, summing, and training of reservoir output, as well as other operations of device 100.

Figure 6:
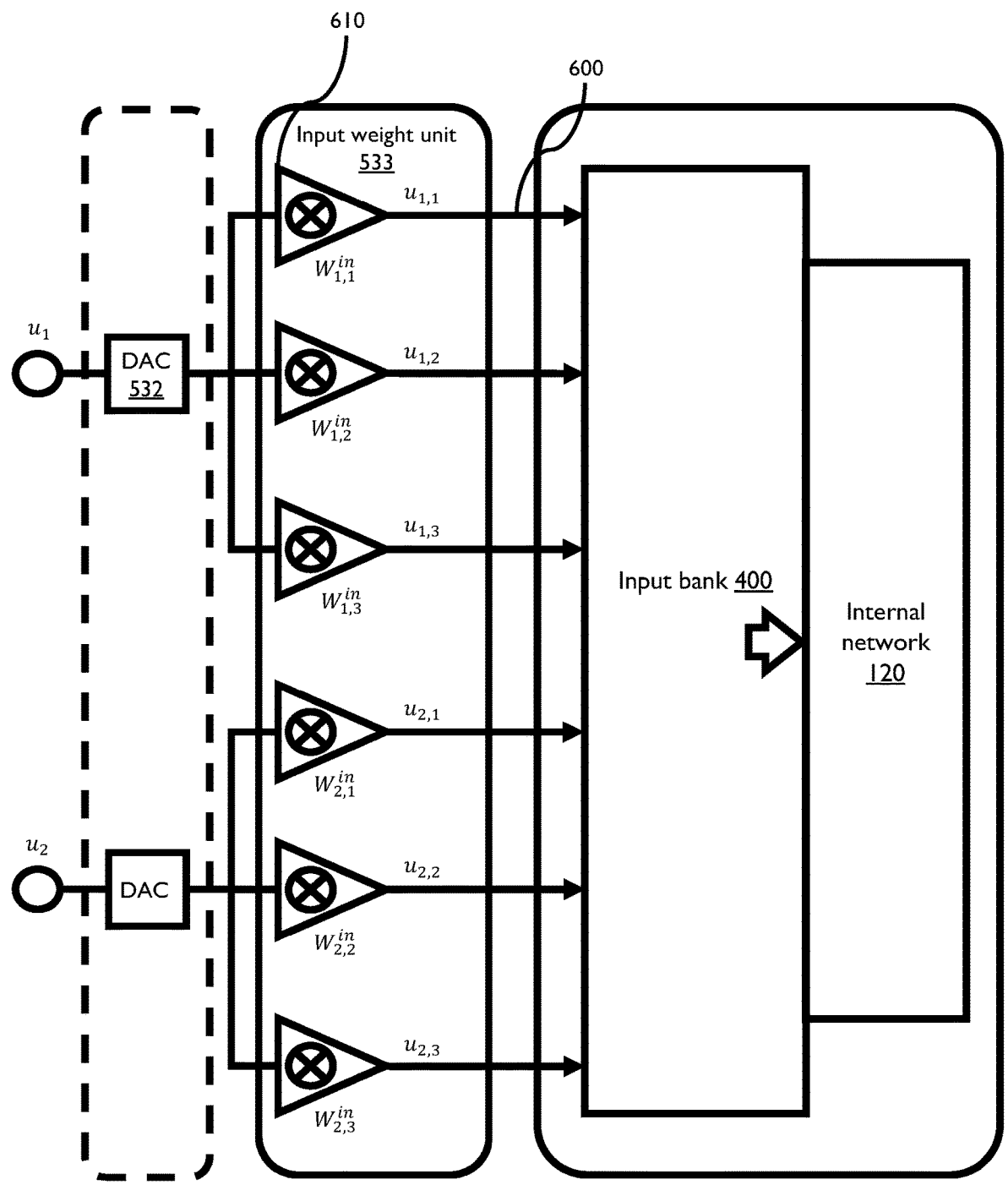
FIG. 6 shows a block diagram of example circuitry for analog input weighting according to embodiments of this disclosure.

A variety of input-processing components can perform input weighting operations in accordance with analog reservoir input weighting embodiments of this disclosure. FIG. 6 shows a block diagram of example circuitry for analog reservoir input weighting according to embodiments of this disclosure. In implementations where the input data is digitally represented in the memory 310, but the internal network 120 receives analog input signals, each of the input signals $u_k(t)$ (k=1, . . . , K) may be converted by a DAC 532 to analog format, before being weighted by input weight unit 533. Each of the signals $u_k(t)$ (k=1, . . . , K) can then be weighted by $N_{in}$ amplifiers 610 of input weighting unit 533. In an example, the input weights $W^{in}$ can include a matrix of real numbers for analog input $W^{in} \in \mathbb{R}^{[K \times N_{in}]}$. The weights $W^{in}$ on the amplifiers 610 can be hardwired or controlled by another set of DACs, such as weight control DAC 531.

In some implementations, input signals $u_k(t)$ (k=1, . . . , K) may have a relatively wide bandwidth, and DAC 532 may be required to transmit converted signals at a rate comparable to that of the processing dynamics of internal network 120. Weights set by weight control DACs 531 can have a comparably relatively narrow bandwidth because weights set by weight control DACs 531 can be set once for a device task and may not need to change during training. In some embodiments, weight control DAC 531 may not be included because the weights set by weight control DACs 531 are hardwired. In implementations where the input signal $u_k(t)$ (k=1, . . . , K) is analog, input signal DACs 532 may not be included, and input signal $u_k(t)$ (k=1, . . . , K) can be connected directly or through a switch to the weighting amplifiers 610 of input weighting unit 533.

Processed input channels 600 can be coupled via, for example, input bank 400 to the inputs of input nodes in the reservoir of internal network 120. Each processed input channel 600 can be wired or otherwise coupled to a subset of one or more nodes 121 of the reservoir of internal network 120, and each node 121 in internal network 120 can be coupled to zero, one, or more different processed input channels 600. In some embodiments, input channels of input layer 110 may be coupled directly to one or more nodes 121 of internal network 120 in accordance with a similar coupling arrangement. Later portions of this disclosure provide further discussion of the reservoir of internal network 120 as well as other components of digital and/or analog input embodiments.

Reservoir

Figure 7:
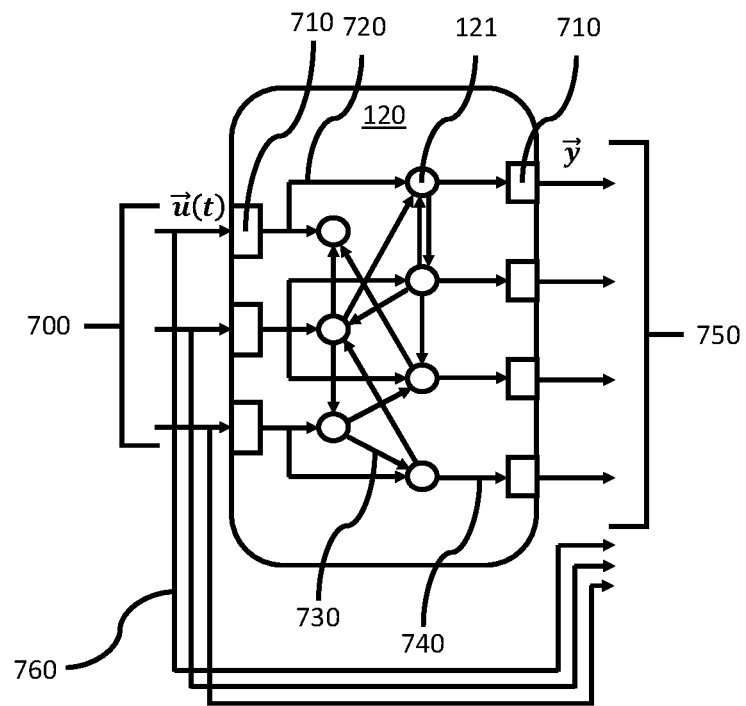
FIG. 7 shows a block diagram of an example reservoir for a device for reservoir computing according to embodiments of this disclosure.

Device 100 may include an internal network 120, which may include an artificial neural network such as a recurrent neural network implemented as a reservoir, according to embodiments of this disclosure. FIG. 7 shows a block diagram of an example reservoir for a device for reservoir computing according to embodiments of this disclosure. Device 100 may include input channels 700, which may carry input signals $\vec{u}(t)$ to internal network 120. Input channels 700 can be coupled to input/output pins 710, and can include processed input channels when input channels 700 receive input from input-processing components. In some embodiments, for example, input/output pins 710 can be input/output elements 230 described above with reference to integrated circuit 200 of FIG. 2. Interconnections such as node input lines 720, node interconnections 730, and node output lines 740 can couple nodes to other nodes of the reservoir as well as to input channels 700 and output channels 750, such as via input/output pins 710. The output signals $\vec{Y}$ of internal network 120 may be transmitted over node output lines 740 to input/output pins 710. Output channels 750 may couple to output pins 710 and may include output processing channels when output channels 750 provide output to output-processing components of device 100. Output signals $\vec{y}$ may be sent over output channels 750 for further processing by other components of device 100 or external to device 100, or as the output of device 100.

In some embodiments of this disclosure device 100 may include pass through channels 760. Pass through channels 760 may directly couple input channels 700 to other components of device 100 such as output layer 130, output-processing components, or output channels 750. In implementations of this disclosure, pass through channels 760 may function as a linear classifier on input signals $\vec{u}(t)$ together with the output of the reservoir of internal network 120. For example, input signals $\vec{u}(t)$ may be passed both from input channels 700 to the internal network 120 as well as to pass through channels 760, avoiding internal network 120. The output of a fixed state bias node can also be included together with the output of internal network 120 and/or signals carried by pass through channels 760 as combined output, according to embodiments of this disclosure.

In embodiments of this disclosure having pass through channels 760, input signals $\vec{u}(t)$ may be received at pass through channels 760 from input channels 700 or may be independently coupled to input channels of input layer 110 and received from input layer 110 directly. For example, in some embodiments, input signals $\vec{u}(t)$ may be received at input layer 110, transmitted to input-processing components such as weighting units, formatting units, and summing units and transmitted to input channels 700 where the input signals $\vec{u}(t)$ may be provided both to internal network 120 and pass through channels 760. In other embodiments, input signals $\vec{u}(t)$ may be received at input layer 110 and provided both indirectly to input channels 700 and/or pass through channels 760 via input-processing components and/or directly to input channels 700 and/or pass through channels 760. Accordingly, in some embodiments, input signals $\vec{u}(t)$ received at input layer 110 can avoid input-processing components before entering internal network 120 and/or pass through channels 760.

In embodiments of this disclosure having pass through channels 760, the input signals $\vec{u}(t)$ passing through pass through channels 760 can be treated as output signals at $\vec{y}$ other components of device 100. For example, in some embodiments output signals $\vec{y}$ from pass through channels 760 may be combined with output signals $\vec{y}$ from output channels 750 before entering output-processing components, such as weighting units, formatting units, and summing units. As another example, in some embodiments output signals $\vec{y}$ from pass through channels 760 and output signals $\vec{y}$ from output channels 750 may be processed independently by output-processing components.

Nodes of a reservoir of device 100 may be implemented in any combination of circuitry suitable for the purposes of this disclosure. For example, nodes 121 of internal network 120 may include logic gates implemented in an integrated circuit, such as integrated circuit 200 described with respect to FIG. 2. Each node 121 in internal network 120 can be a digital circuit that includes transistors and other circuitry designed to function as logic gates to perform logic operations. For example a node 121 can include a logic element 211 and/or a logic block of logic elements 211 as described in FIG. 2. Nodes 121 can include any suitable combination of circuitry to perform any logical operation suitable for the purposes of this disclosure. For example, nodes 121 may include circuitry suitable to perform logical operations such as conjunction operations (AND), disjunction operations (OR), negation operations (NOT), exclusive or operations (XOR), biconditional operations (XNOR), NAND operations, and/or operations in accordance with general look-up specifications.

The logic operations by nodes 120 can be represented by a lookup table, in accordance with embodiments of this disclosure. For example, each node 121 can form a logic gate based on the number of connections to the node 121 and a look-up table that specifies the gate type (AND, OR, NOT, XOR, XNOR, NAND, or wholly general look-up specifications). Look-up tables can be arrived at via a variety of recipes regarding the logic gate types. For example, such recipes can include a prescribed distribution of gate types, probabilistic designs based on the probabilities of outputting zero or one and/or on the sensitivity of the outputs of the nodes 121 to changing inputs.

According to embodiments of this disclosure, coupling between nodes in internal network 120 can be implemented by wiring the output of nodes 120 to inputs of other nodes 120, such as is shown with respect to node interconnections 730 and as described above with respect to interconnections 220 in FIG. 2. The connectivity between nodes 121 may be specified by an adjacency matrix for the directional graph specifying the internal wiring of the collection of nodes in a graph for internal network 120. A variety of recipes regarding the number and/or probability of node connections can be prescribed. In implementations of this disclosure, the adjacency matrix can dictate the distribution of node interconnections 730, input lines 720, and/or output lines 740, among nodes 121 in internal network 120. In some embodiments of this disclosure, there may be no node interconnections among any nodes 121 in internal network 120. For example, each node 121 in the reservoir may be connected to one or more input lines 720 and output lines 740, with no node interconnections 730 among any nodes 121 in the reservoir.

In some implementations of this disclosure, the distribution of interconnections in internal network 120 can be parametrically random. The term "parametrically random" can refer to randomness within certain constraints. For example, a connection between a first node 121 and a second node 121 may be randomly selected to be connected, but the trace that forms the interconnection between the first node 121 and second node 121 can be constrained by a parameter such as the physical dimensions of the device 100 of which the first node 121 and second node 121 are a part. Other parameters that may constrain the random nature of interconnections may be layout design rules. These design rules may include, for example, specific distances between conductive traces and that a trace may not intersect itself. In some examples, the interconnections may be further constrained by global parameters that define characteristics of the population of interconnections. For example, these global parameters may include defining an average number of connections per node 121, maximum allowable interconnection distance, averages electrical resistance for the interconnections, or other global parameters.

Interconnections among nodes 121 in reservoir of internal network 120 can have binary weighting, according to embodiments of this disclosure. For example, a node 121 can have a weight of "1" with respect to another node 121 if it is coupled to the other node 121 or a weight of "0" with respect to the other node 121 if it is not. The distribution of interconnections within the reservoir can be restricted from changing during training and operation of device 100, and the interconnected network of the reservoir may be described by an adjacency matrix of the underlying directed graph of internal network 120.

As discussed above, nodes 121 of internal network 120 may be implemented in an integrated circuit, such as integrated circuit 200 described with respect to FIG. 2, according to embodiments of this disclosure. For example, each node of a set of nodes in the reservoir can be programmable and integrated with the set of input channels, a set of interconnections, and a set of weighting units in a programmable logic device, such as an FPGA. In such embodiments, nodes 121 and/or interconnections 122 can be implemented in programmable logic elements and programmable interconnections, such as logic elements 211 and interconnections 220. For example, nodes 210 can be configured to operate as various nodes of a reservoir based on a lookup table. In other embodiments, nodes 121 can be implemented in hardwired integrated circuitry, such as an ASIC. Such hardwired integrated circuitry can be difficult to substantially change after fabrication.

It can be beneficial to be able to configure or otherwise program the operation of nodes 121 when nodes 121 are implemented in hardwired circuitry. For example, changing the operation of a node can be useful to optimize the processing in internal network 120 for different tasks. The logic gates of a hardwired node can be programmed or reconfigured, for example, by combining multiple fixed function gates into one configurable function gate. In some embodiments of this disclosure, a device, such as device 100 can include a set of input channels, such as input channels of input layer 110 or processed input channels, and a set of programmable nodes, such as nodes 121, which can be integrated in a hardwired, integrated circuit, such as an ASIC. Device 100 may include one or more control lines coupled to programmable nodes, and circuitry coupled to the control lines to provide control signals to configure the programmable nodes. A subset of the set of programmable nodes can be coupled to the set of input channels. Each node of the set programmable nodes can have a binary weight and include a Boolean logic gate that can perform a non-linear operation on a set of input signals. Device 100 can include set of interconnections, such as interconnections 122, each of which may couple together two or more nodes of the set of programmable nodes.

Figure 8:
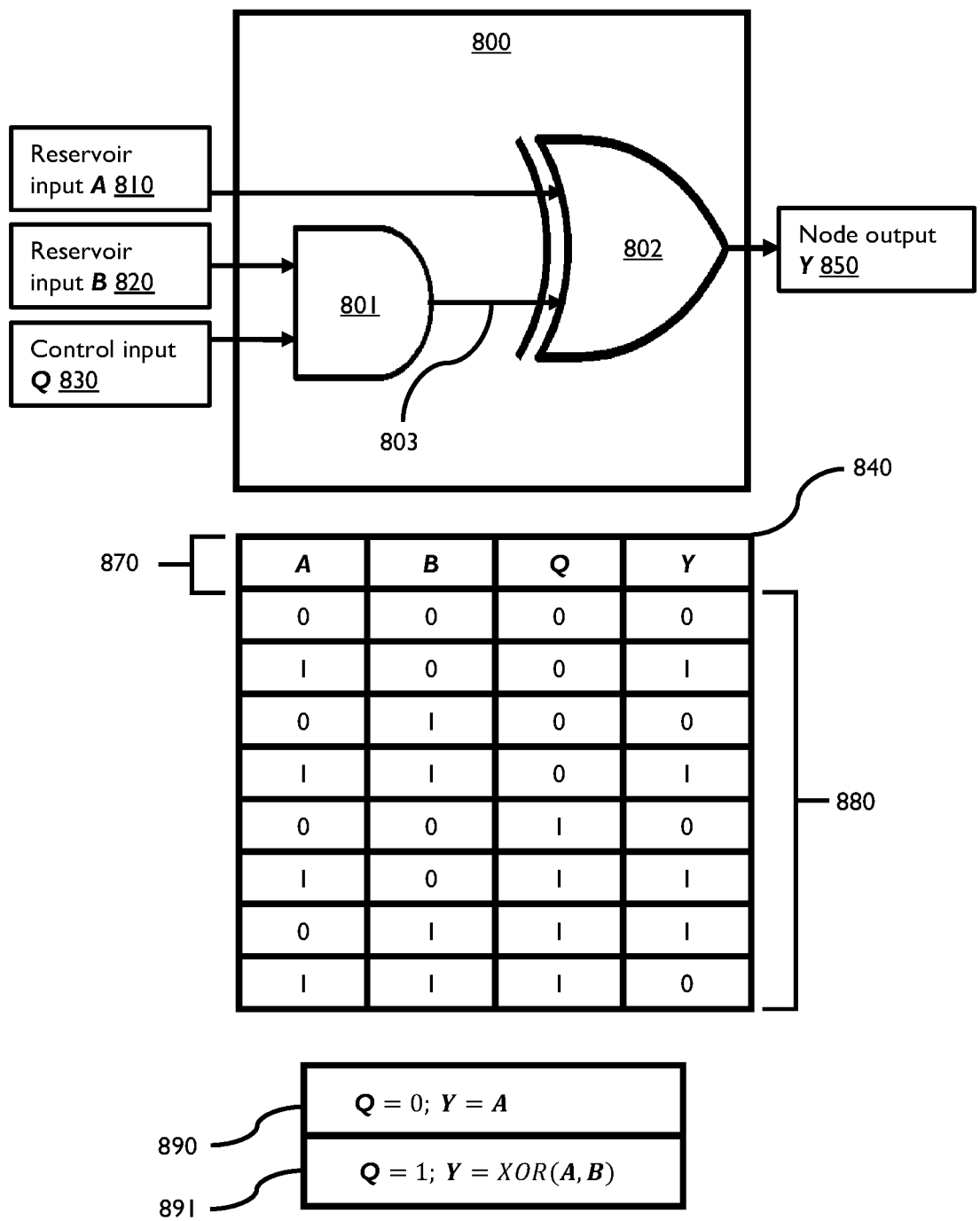
FIG. 8 shows a block diagram of a reconfigurable node for a device for reservoir computing according to embodiments of this disclosure.

In embodiments of this disclosure having a set of programmable or reconfigurable nodes implemented in a hardwired integrated circuit, the device 100 can include a microcontroller that has one or more control lines and that is integrated into the integrated circuit. Control lines of the microcontroller may be coupled to one or more nodes of the set of programmable nodes and may be distinct from interconnections 122. FIG. 8 shows a block diagram of an example programmable or reconfigurable node for a device for reservoir computing according to embodiments of this disclosure. In FIG. 8 programmable or reconfigurable node 800 can include a Boolean logic gate that is, for example, a combination of AND gate 801 and XOR gate 802. AND gate 801 can include reservoir input channel B 820 and control input channel Q 830. Control input channel Q 830 may be, for example, a control line coupled to a microcontroller of device 100. Reservoir input channel B 820 can be, for example, an interconnection of interconnections 122 that carries signals such as the output of another node in the reservoir of internal network 120, repeated output from node 800 itself, or an external input signal to the reservoir of device 100. An external input signal to the reservoir of device 100 can include an input from, for example, an input channel of input layer 110, a processed input channel 420, and/or a processed input channel 600. A signal carried by control input channel Q 830 can include, for example, a digital control signal provided by a microcontroller coupled to node 801. XOR gate 802 can include reservoir input channel A 810, which can be an interconnection of interconnections 122 such as is discussed with respect to reservoir input channel B 820, and the output channel 803 of AND gate 801. The node output channel Y 850 can be the output channel of XOR gate 802.

Example operations of node 800 according to implementations of this disclosure are shown in table 840. The values 880 can be the potential values of the signals carried on reservoir input channel A 810, reservoir input channel B 820, control input channel Q 830, and node output channel Y 850 as respectively labeled in row 870. As shown in equations 890, in operation of node 800, when the value of the signal provided by control input channel Q 830 is "0," the value of the node output channel Y 850 can be whatever value is provided by reservoir input channel A 810. As shown in equation 891, when the value provided by control input channel Q 830 is "1," the value provided at the node output channel Y 850 can be whatever the output is of the XOR operation on the values provided by reservoir input channel A 810 and reservoir input channel 8820. The example of reconfigurable or programmable nodes depicted in FIG. 8 is for illustrative purposes only. This disclosure contemplates other combinations of logic gates that may be beneficial to provide for programmable or reconfigurable hardwired nodes, and embodiments of nodes can include any combination of logic gates suitable for the purposes of this disclosure.

Figure 9:
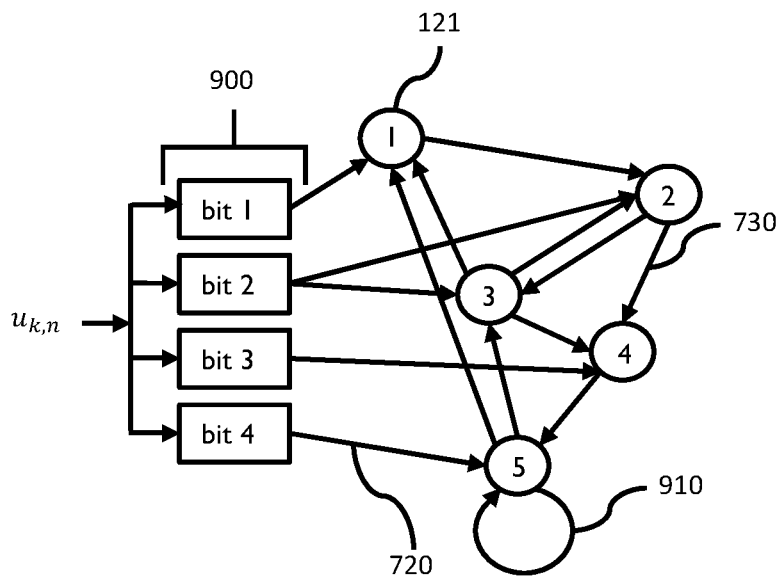
FIG. 9 shows a block diagram of example node interconnections for a device for reservoir computing according to embodiments of this disclosure.
Figure 10:
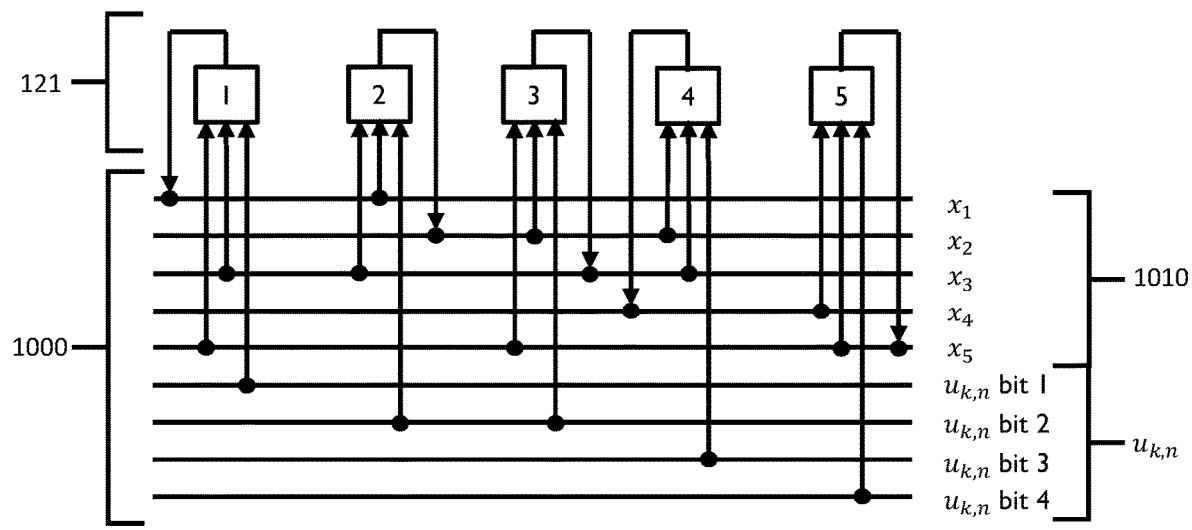
FIG. 10 shows a block diagram of example node interconnections for a device for reservoir computing according to embodiments of this disclosure.

Nodes 121 in reservoir of internal network 120 can interact in various ways depending on the distribution of interconnections in the reservoir. FIGS. 9-10 show a block diagram of example node interconnections for a device for reservoir computing according to embodiments of this disclosure. Inputs signals to one node 121 may be, for example, any number of signals transmitted from other nodes in the network, a delayed replica of its own output, a signal transmitted from an input channel to the reservoir, and/or a reset line r={0,1} such as discussed in further detail below. As shown in FIG. 9, input signals $u_{k,n}$ can include four bit signal components 900, indexed as bit 1, bit 2, bit 3, and bit 4. Node input interconnections 720 may connect the one bit signal components 900 to each of nodes 121, indexed as node 1, node 2, node 3, node 4, and node 5. Nodes 1-5 may be interconnected by node interconnections 730. Some node interconnections from a particular node may reconnect to the node that the interconnection originates from. For example, node 5 may connect to interconnection 910, which may cause node 5 to receive a delayed replica of node 5's own output. FIG. 10 further illustrates the interconnections for each node 1-5 of nodes 121. As shown, lines 1000 include input sources for nodes 1-5 of nodes 121. Input sources can include bit components, 1-4 of input signals $u_{k,n}$ and the outputs 1010 $x_1$, $x_2$, $x_3$, $x_4$, $x_5$ of nodes 1-5. For example, node 4 can receive an input signal from bit signal component 3 and as well as signals $x_2$ and $x_3$ output from nodes 2 and 3 respectively. Further discussion of reset lines and other inputs to nodes 121 are included below.

Figure 11:
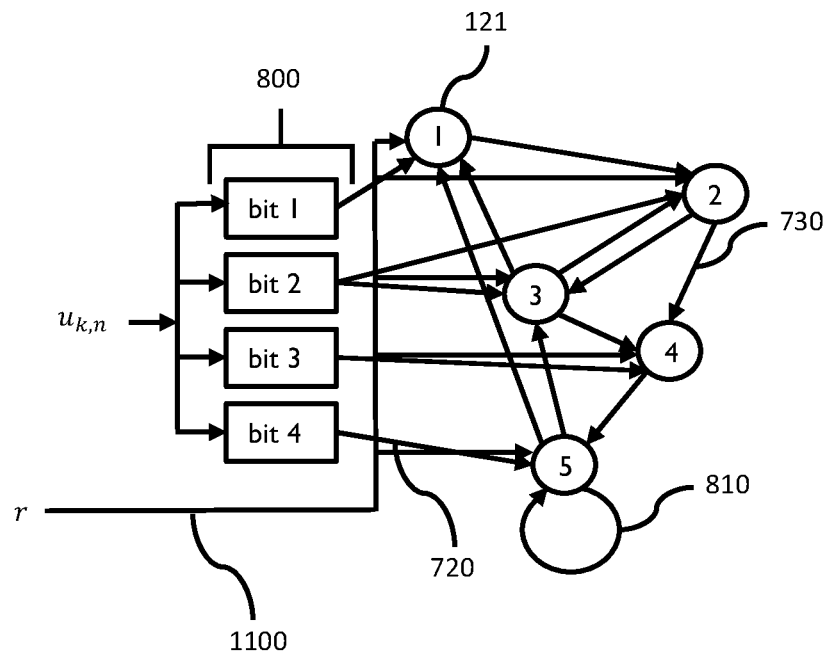
FIG. 11 shows a block diagram of example node interconnections having a reset line for a device for reservoir computing according to embodiments of this disclosure.
Figure 12:
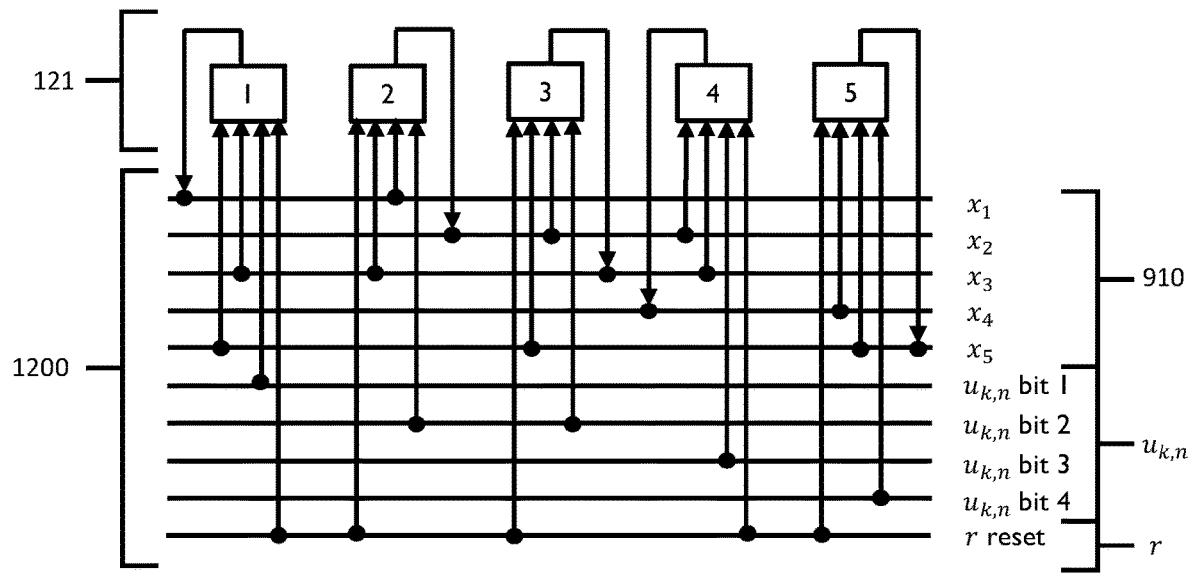
FIG. 12 shows a block diagram of example node interconnections having a reset line for a device for reservoir computing according to embodiments of this disclosure.

According to embodiments of this disclosure, internal network 120 can include nodes 121 having circuitry to reset the nodes 121 to a common state. For example FIGS. 11 and 12 show block diagrams of example node interconnections that include a reset line for a device for reservoir computing according to embodiments of this disclosure. As shown in FIG. 11, device 100 can include a reset line 1100, which can couple to each node 1-5 of nodes 121. Device 100 can send a reset signal r, which can reset nodes 121 to a common state. As show in FIG. 12, lines 1100 can include signal r among input sources for nodes 1-5 of nodes 121. Resetting nodes 121 can be beneficial in high speed pattern recognition tasks, for example, to clear activity within internal network 120 before new input data is entered into the reservoir.

The circuitry of a node of nodes 121 can be designed to output a function of its inputs, such as a digital function, according to embodiment of this disclosure. For example a node indexed 2, such as node 2 of nodes 121, may have four inputs and thus can receive four input signals. As shown in FIG. 12 lines 1200 can include reset signal r. Two of the four input signals for node 2 can be from two other nodes, indexed 1 and 3. Node 2 may also have bit signal component 2 from the input signal $u_{k,n}$ and one reset signal r. The circuitry of node 2 of nodes 121 can be designed, for example, to perform the following digital function:

$$x_2 = f^{(p)}(f_2^{(i)}(x_1, x_3), u_{1,2}) | r$$

The digital function referenced above generally does not accurately describe the transfer functions of nodes 121, according to embodiments of this disclosure. For example, the above digital function does not include the continuous analog response and/or the time delay of the transfer functions that can be present in nodes 121. However, such a digital function can be useful to explain how the hardware that makes up a node 121 can be configured, according to embodiments of this disclosure.

In this example $x_1$ can be the output of the j'th node and $f_j^{(i)}$ (a, b) can be the two input Boolean function of the j'th node with respect to its input from other nodes 121 in the internal network 120. $f^{(p)}$ can be the two input Boolean function between $f_j^{(i)}$ and the external input line $u_{1,2}$. The symbol "|" can represent the local operation, OR between $f^{(p)}$ and the reset value r. The number of arguments to the function $f_j^{(i)}$ can be larger or smaller than two and can vary among different nodes 121. All nodes 121 can be designed with the same Boolean function $f_j^{(i)}$ or the function may differ from one node to another.

In general, reset line 1100 can provide any reset signal pattern that causes all nodes 121 connected to reset lines to be reconfigured to a desired state. For example, the reset line 1100 may be a single digital channel with value r={0,1} that connects to inputs of all the nodes 121 in the internal network 120. For example, when r=0, outputs from nodes 121 can be a function of their other inputs and when r=1, node outputs from nodes 121 can all be set equal to 1 and the network state can be reset to an all "1" state. Implementations reset lines in this disclosure can include any reset signal pattern suitable for the purposes of this disclosure.

In implementations of this disclosure, the processing dynamics of a reservoir may be configured by adjusting certain characteristics or combinations of characteristics of the reservoir. For example, characteristics can include the number of interconnections 122 among nodes 121 in the reservoir, the distribution of interconnections 122 among nodes 121, the density of interconnections 122 among nodes 121, the types of logic gates included in one or more nodes 121, the sensitivity one or more nodes 121, the mean sensitivity of nodes 121, the activity level parameter of nodes 121, the ratios of types of logic gates included in nodes 121, the transfer function characteristics of one or more nodes 121 or one or more logic gates of nodes 121, the power supply voltage provided to one or more nodes 121, and the distribution of power supply voltages among nodes 121 in the reservoir. Such characteristics may be selected to optimize various tasks according to implementations of this disclosure, such as the analysis of temporal patterns by the reservoir of internal network 120.

Characteristics of the reservoir of internal network 120 may be configured to account for the reservoir's transient memory time $\tau_m$, according to embodiments of this disclosure. The transient memory time $\tau_m$ can, for example, be the amount of time in which a test sequence can be reconstructed at the output layer 130 after the test sequence has been input at input layer 110. In tasks where temporal patterns in the input signal are to be learned by device 100, the transient memory time $\tau_m$ of internal network 120 may need to be tuned to exceed the time scale of the learned patterns in the input signals to internal network 120.

The transient memory time $\tau_m$ for the reservoir can be set by characteristics such as the activity level parameter $\alpha$ of the reservoir, according to implementations of this disclosure. The activity level parameter $\alpha$ of the reservoir of internal network 120 may be determined based on further characteristics of the reservoir, such as the density of interconnections p among nodes 121 and the mean sensitivity $\sigma_m$ or nodes 121 or one or more logic gates of nodes 121.

In implementations of this disclosure the density of interconnections p may be determined in one or more ways. For example, the density of interconnections p can be based on a calculation of the number of interconnections 122 among nodes 121 divided by the number of nodes 121 squared, or the density of connections p can be based on a calculation of the number of interconnections 122 among nodes 121 divided by the number of potential interconnections among nodes 121. The number of potential interconnections among nodes 121 may be, for example, the number of total interconnections 122 that would result if each node 121 in internal network 120 is connected to every other node in internal network 120.

In embodiments of this disclosure, the sensitivity of a node a may be the ratio of changes in any single input value of the logic gate of the node that triggers a change in the logic gate's output value. For example, an XOR logic gate with first input argument value "0" and second input argument value "1" can have an output value "1": XOR(0,1)=1. If the first input argument changes from "0" to "1" or the second input argument changes from "1" to "0," in response, the output can change from "1" to "0": XOR(1,1)=0, XOR(0,0)=0. Thus, the output of the XOR logic gate can change following a change in one of its input values no matter what the current values are. As a result, the XOR logic gate can be the most sensitive two-input digital gate and thus a node, such as node 121 implementing the XOR logic gate can have a sensitivity $\sigma=1$.

In contrast AND logic gates or OR logic gates can have a sensitivity $\sigma=0.5$ because only half the changes in the input values of an AND logic gate or an OR logic gate may lead to a change in the output of such logic gates. A logic gate designed to always output a constant value, such as "1" or "0," may inhibit activity levels and thus may have a sensitivity $\sigma=0$. Other sensitivity values for other type of logic gates may be determined in a similar manner, according to implementations of this disclosure. The mean sensitivity $\sigma_m$ of a reservoir can be the average of the sensitivities of all nodes in the reservoir. For example, the mean sensitivity $\sigma_m$ of the reservoir of internal network 120 can be the average of the sensitivities a of all nodes 121 in the reservoir: $\sigma_m = \langle a \rangle$ over all nodes 121.

As discussed above, the transient memory time $\tau_m$, for a reservoir can be set by characteristics such as the activity level parameter $\alpha$ of the set of nodes of the reservoir, which can be based on further characteristics of the reservoir, such as the density of interconnections $\rho$ and the mean sensitivity $\sigma_m$, nodes in the reservoir. For example, in implementations of this disclosure, the activity level parameter $\alpha$ can be based on a calculation of the product of the density of interconnections p and the mean sensitivity $\sigma_m$: $\sigma=\rho \cdot \sigma_m$ In embodiments of this disclosure, for $0 < \rho \leq 1$ and $0 < \sigma_m < 1$, activity level parameter $\alpha$ also may have the same range of values: $0 < \alpha < 1$. For a smaller than a threshold activity level parameter value $\alpha_t \approx 0.55$, the reservoir of internal network 120 can have a finite transient memory time $\tau_m$. In implementations of this disclosure, a device 100 having an internal network 120 with an activity level $\alpha$ below about 0.55 can exhibit high performance of temporal pattern analysis tasks. Generally, the higher the value of a under the condition of $\alpha < \alpha_t$, the larger transient memory time $\tau_m$ may be. For reservoirs having activity level parameter $\alpha > \alpha_t$, the resulting transient memory times may depend on additional characteristics. Embodiments of this disclosure may include reservoirs having activity level parameters a above or below about 0.55. For example, in embodiments of this disclosure a set of interconnections in a reservoir may be distributed among the set of nodes in the reservoir in accordance with a value less than about 0.55 for a product of an interconnection density of the set of interconnections and a mean sensitivity of each Boolean logic gate in the set of nodes.

The set of interconnections of a reservoir can be distributed in accordance with an activity level parameter for the set of nodes that make up the reservoir, according to embodiments of this disclosure. For example, according to embodiments of this disclosure, device 100 can include a set of input channels, such as the input channels of input layer 110, and a set of nodes, such as nodes 121 that make up a reservoir of an internal network of the device, such as internal network 120. A subset of the set of nodes can be coupled to the set of input channels. Each node of the set of nodes can include a Boolean logic gate that can perform a non-linear operation on a set of input signals. The device can include set of interconnections, such as interconnections 122, each of which may couple together two or more nodes of the set of nodes. The set of interconnections in the device can be distributed among the set of nodes in accordance with a characteristic, such as an activity level parameter $\alpha$ of the set of nodes. For example, a particular activity level parameter $\alpha$ may be determined by a particular interconnection density $\rho$ of the set of interconnections. Thus the set of interconnections may be distributed among the set of nodes in a manner that corresponds to the particular interconnection density $\rho$ that determines the particular activity level parameter $\alpha$.

In embodiments of this disclosure, the activity level parameter $\alpha$ can be based on characteristics such as an interconnection density $\rho$ of the set of interconnections, a mean sensitivity $\sigma_m$ of the set of nodes or logic gates that make up the set of nodes, and/or a product of an interconnection density $\rho$ and a mean sensitivity $\sigma_m$. The values of interconnection density $\rho$ and/or mean sensitivity $\sigma_m$ may be selected to result in a particular activity level parameter $\alpha$ of internal network 120 and used to tune the transient memory time $\tau_m$, of internal network 120 in accordance with specific tasks. For example, in some embodiments the mean sensitivity $\sigma_m$ of the nodes in the reservoir may be fixed and thus the interconnection density $\rho$ may be adjusted to result in a desired activity level parameter $\alpha$. In some embodiments the interconnection density $\rho$ may be fixed, and thus the mean sensitivity $\sigma_m$ may be adjusted to result in a desired activity level parameter $\alpha$. In some embodiments the interconnection density $\rho$ and the mean sensitivity $\sigma_m$ may both be adjusted to result in a desired activity level parameter $\alpha$. Tasks that require longer transient memory times $\tau_m$ may require larger values of $\rho$ and $\sigma_m$.

As discussed above, embodiments of this disclosure may include a reservoir where the set of interconnections are distributed in accordance with characteristic, such as an activity level parameter $\alpha$ that is less than or equal to about 0.55. In such embodiments, each node of the set of nodes included in the reservoir can have a binary weight and/or may be programmable and integrated with the set of interconnections in a programmable logic device, such as an FPGA, or a hardwired integrated circuit, such as an ASIC. In other embodiments at least one of a distribution of the set of interconnections among the a set of nodes 121 in internal network 120 and a type of Boolean logic gate of a node of the set of nodes can be based on a transient memory time of the device 100.

The transient memory time $\tau_m$ can also be adjusted by introducing a delay into internal network 120, according to implementations of this disclosure. For example, a node 121 can implement a single input logic gate, such as a NOT logic gate or an identity transfer logic gate that can introduce a delay in the signal, without performing any non-linear logic operation on the inputs to node 121. By increasing the ratio of single input gates within internal network 120 the rate of non-linear processing of the input data by internal network 120 can be decreased as more delays are introduced. There can be benefits to slowing down the rate of processing in network 120. For example, by slowing down processing in internal network 120, the internal network 120 can match the time scales of slower clock frequencies of input later 110 and output layer 130 relative to the fast processing dynamics of the unclocked internal network.

In implementations of this disclosure, the processing dynamics of internal network 120 can be adjusted by controlling the transfer function characteristics of nodes 121 or logic gates of nodes 121. A transfer function of a node or the logic gate of a node can be the specification of output voltages from the node or logic gate when provided specified input voltages. For example the transfer function of a logic gate implemented by a particular node 121 can be adjusted by changing the characteristics of the transistors included in the logic gates of the particular node 121. As another example, the transfer function of a logic gate implemented by a node 121 can be adjusted by increasing or decreasing the voltage provided to that node 121. The transfer functions of a set of nodes 121, such as all nodes 121 in internal network 120 can be adjusted by adjusting the total power supply voltage applied to the set of nodes 121 in internal network 120. The power supply voltages may be the voltage supplied to a node as a whole, as opposed to, for example, the voltage supplied to an input of a node. Particular power supply voltages can influence characteristics, such as a node's electrical response. For example, power supply voltages can generate non-linear behavior in nodes having logic gates implemented in complementary metal-oxide-semiconductor (CMOS) transistors. Accordingly, in embodiments of this disclosure, a transfer function characteristic of nodes can be distributed among a set of nodes in internal network 120 based on at least one selected from the group consisting of: a transistor characteristic of a Boolean logic gate of at least one node of the set of nodes, a power supply voltage provided to a node of the set of nodes, and a power supply voltage applied to the set of nodes.

Figure 13:
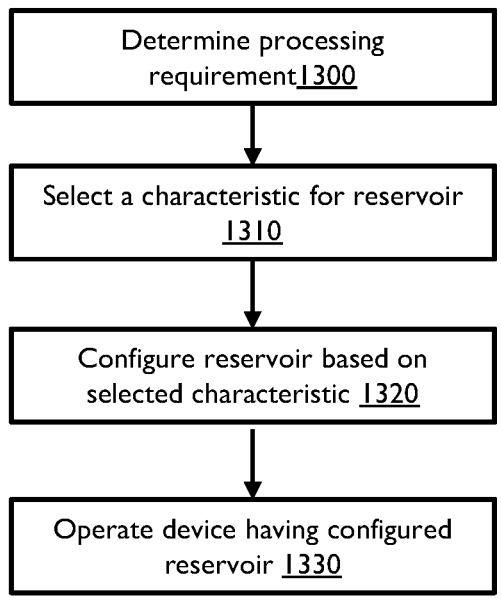
FIG. 13 shows a flowchart of an example method for configuring a reservoir for a device for reservoir computing according to embodiments of this disclosure.

As discussed above the processing dynamics of the reservoir of internal network 120 can be configured based on selected characteristics of the reservoir. FIG. 13 shows a flowchart of an example method for configuring a reservoir for a device for reservoir computing according to embodiments of this disclosure. At 1300, a computing device, such as any of the computing devices described below with respect to FIG. 22, can determine a processing requirement for the reservoir, such as the reservoir of internal network 120. The reservoir processing requirement may be, for example, a transient memory time $\tau_m$ needed to exceed the time scale of the learned patterns in the input signals to internal network 120, the need for the device 100 to perform a temporal pattern analysis task, and/or any other processing requirement suitable for the purposes of this disclosure.

The computing device can select a characteristic for the reservoir based on the determined processing requirement at 1310. For example, a particular activity level α, such as 0.55 may be associated with beneficial performance of a temporal pattern analysis task. The computing device can select a characteristic for the reservoir based on the determined processing requirement by selecting characteristics for the reservoir that result in the particular activity level. For example, the computing device can select a mean sensitivity $\sigma_m$ and/or density of connections p that will result in the particular activity level. In some implementations, a user may determine the reservoir processing requirement and/or select the characteristic for the reservoir.

The computing device can configure the reservoir based on the selected characteristic at 1320. For example the computing device can be in communication with device 100 implementing the reservoir of internal network 120. Device 100 may include configurable integrated circuitry, such as a FPGA or an ASIC having programmable nodes. The computing device can execute instructions to configure device 100 based on the selected characteristic. For example, the selected characteristic may be a mean sensitivity $\sigma_m$ for the reservoir, and the computing device, may execute instructions to configure one or more logic gates of nodes 121 to result in the mean sensitivity characteristic. In another example, the characteristic may be a power supply voltage level applied to nodes 121, and the computing device can execute instructions to adjust the power supply voltage available to nodes 121 to meet the selected characteristic. In other examples, the computing device can configure the reservoir based on a reservoir activity level that is based on a density of interconnections p in the set of interconnections among nodes 121, a mean sensitivity of each Boolean logic gate included in nodes 121; and/or a product of a density of interconnections in the set of interconnections among nodes 121 and a mean sensitivity of each Boolean logic gate in nodes 121.

At 1330, the computing device can operate the configured reservoir. For example, the computing device can execute instructions to provide source data to device 100, such as a series of images or other data represented in temporal patterns. Device 100 can process the source data using the configured reservoir and provide output signals based on the processed source data. For example device 100 can classify or identify content of the series of images.

In some implementations, input data may be processed by a recurrent neural network that recursively applies the same transformation, such as rotations, translations, and other affine morphings or distortions of that input data. Any sequence of transformations that can be approximately constructed from a single generator such as a matrix that acts on the state vector and is activated by a transfer function at each iteration, can be realized as a recurrent neural network. For instance, a classifier can be constructed on the output of the recurrent network that is more transformationally invariant than a classifier defined on static inputs since the classifier can be trained to recognize a specific presentation of the input pattern in terms of orientation, translation, or other transformation. For example, a sequence of rotations that successively rotate an input image by 5 degrees can be realized in hardware as a recursive application of a rotation matrix that approximately rotates the binary image pixels by 5 degrees. For instance, a binary image comprised of N pixels can be input to a recurrent neural network on N nodes such that the network evolves by transforming the node state of each node j to the Boolean value of the nearest neighbor of the preimage of the jth pixel under the 5 degree approximate rotation; at each iteration the recurrent neural network performing a successive rotation of the image and presenting the rotated image to the next layer of the device. In some implementations, the angle could also be inferred by interrogation of a series output of the classifier, and more generally, the element of the transformation sequence that best approximates the transformation of input data relative to the target pattern could be determined. The host computing device may provide the input data to device 100. A reservoir of internal network 120 of device 100 may process the input data to perform pattern recognition operations on the input data representing the series of rotations or spatial transformations of the particular data instances, according to implementations of this disclosure.

Output Layer and Output-Processing Components

Device 100 may include an output layer 130 that can include a set of one or more channels that directly or indirectly receive output signals from a set of some or all nodes 121 in reservoir of the internal network 120, according to embodiments of this disclosure. The output signals carried by the output layer 130 can be a linear combination of the output of all the nodes 121 in the reservoir. Output-processing components of device 100 can perform operations on the output signals received from output nodes of the reservoir before the output signals are provided to output layer 130, including operations such as signal conversion, weighting, and formatting.

Device 100 can produce a number $N_t$ of time varying digital or analog output signals, according to embodiments of this disclosure. The output signals can be represented by a time varying vector $\vec{y}(t)=(y_1(t), y_2(t), \ldots, y_Q(t))$. The signal in the q'th output channel of output layer 130 may be constructed by a weighted sum of the outputs of $N_{out}$ output nodes in the internal network 120, $y_q(t)=\Sigma_{n=1}^{N_{out}} W_{q,n}^{out} x_n$. Output nodes may include some or all nodes 121 in internal network 120. There can be $N_{out}$ output weights for the signal in each output channels, and there can be $Q \times N_{out}$ output weights used to produce weighted signals for all Q output channels in $\vec{y}(t)$.

Devices, such as device 100, can implement various techniques to weight output signal $\vec{y}(t)$, according to embodiments of this disclosure. For example, in some embodiments of this disclosure, a device, such as device 100 can include a set of input channels, such as input channels of input layer 110, and a set of nodes, such as nodes 121. A first subset of the set of nodes can be coupled to the set of input channels. The first subset of nodes can include fewer or the same number of nodes as the set of nodes. Each node of the set nodes can have a binary weight and include a Boolean logic gate that can perform a non-linear operation on a set of input signals. The device 100 can include set of interconnections, such as interconnections 122, each of which may couple together two or more nodes of the set of nodes. As discussed further below, the device 100 can include a set of weighting units, each of which can be coupled to a second subset of the set of nodes. The set of weighting units can each select a weighted sum based on a node state of the respective second subset of the set of nodes to which it may be coupled.

Figure 14:
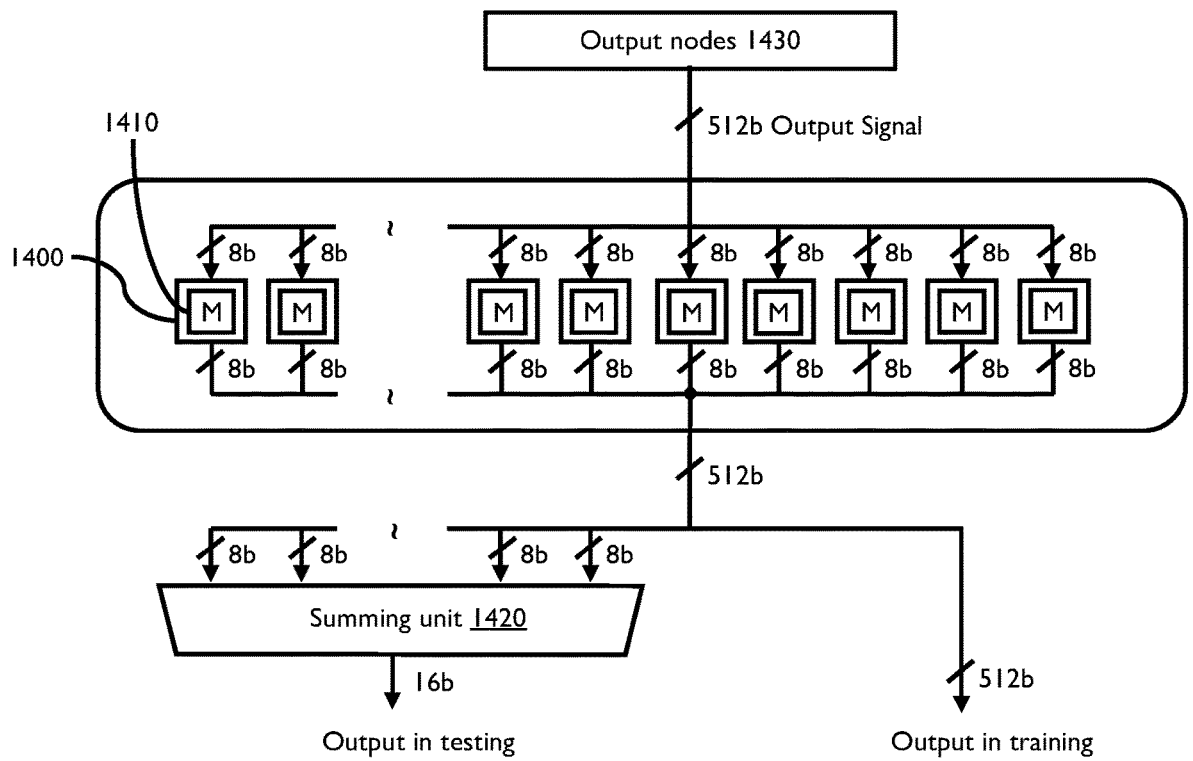
FIG. 14 shows a block diagram of example digital, memory-based output weighting and summing according to embodiments of this disclosure.

A weighting unit may include any combination of circuitry suitable for the purposes of this disclosure to select output weights for output signals from a set or subset of nodes to which the weighting unit is coupled. For example, FIG. 14 shows a block diagram of example digital, memory-based output weighting and summing, according to embodiments of this disclosure. In embodiments such as that shown in FIG. 14 weighted sums may be stored in memory units 1410 included in or coupled to weighting units 1400. A memory unit 1410 and/or weighting unit 1400 can be coupled to a set of nodes, such as a subset of the set of nodes of a reservoir of a device, such as device 100. As discussed further below, a set of weighted sums stored in a particular memory unit 1410 can correspond to the subset of nodes to which the particular memory unit 1410 is coupled. Weighted sums may be accessible by weighting units 1400 by, for example, memory lookup processes that operate on memory units 1410. Accordingly, a weighting unit including or coupled to a memory unit storing a set of weighted sums can select a weighted sum from among the set of weighted sums for the subset of nodes to which the memory unit is coupled.

Figure 22:
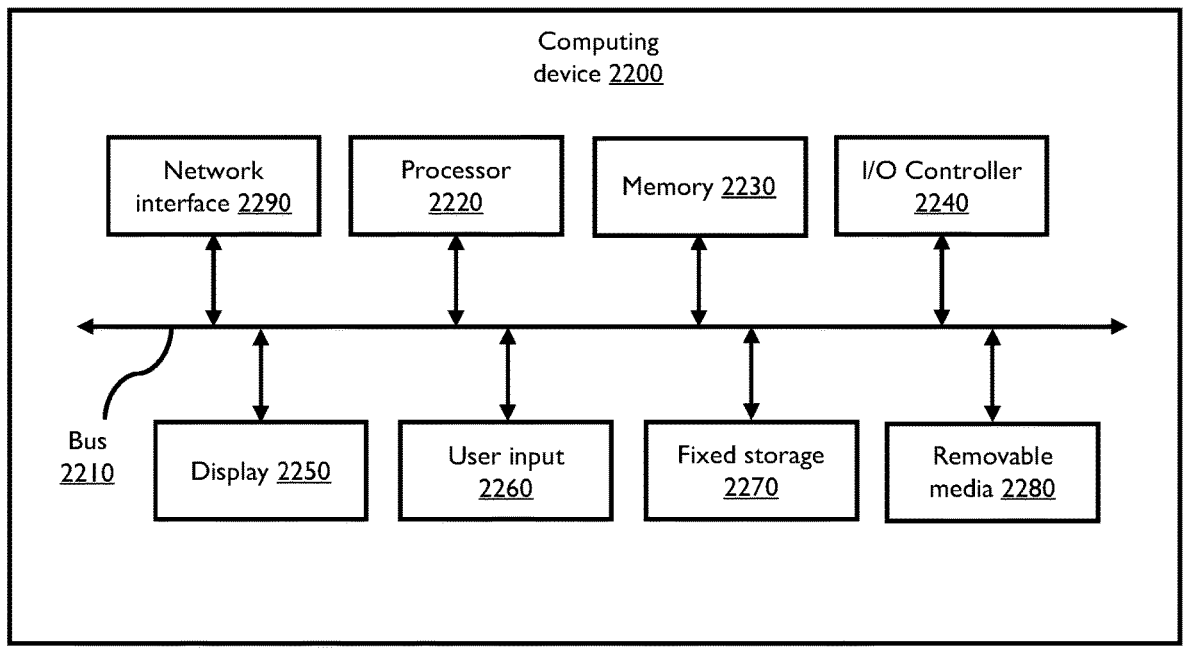
FIG. 22 shows an example computing device according to embodiments of this disclosure.

Memory units 1410 can be any memory circuitry suitable for the purposes of this disclosure, such as RAM or other suitable memory types discussed below with respect to FIG. 22. For example, in some embodiments, memory units 1410 may be distributed memory elements, such as distributed RAM. In some embodiments, memory units 1410 may be discrete areas of a single memory element. Weighting units 1420 can be any combination of circuitry suitable for the purposes of this disclosure. For example, in some implementations, weighting units 1400 can be implemented by control unit 320. In some implementations, weighting units 1400 may be a single component or process for accessing memory units 1410. Weighting units 1400 can be coupled to summing unit 1420, and summing unit 1420 can sum the weighted output signals provided by weighting units 1400. The weighted, summed, output signal can be provided as the output of device 100. In some implementations, the output of weighting units 1400 can be provided to other components in communication with device 100, such as during training operations as discussed further below.

In implementations of this disclosure, the output layer 130 may provide output signals that correspond to states of each of the $N_{out}$ output nodes 121 that are directly or indirectly coupled to output channels of the output layer 130. In training operations of device 100, output-processing components and/or the output layer 130 may perform an identity function on the output signals from output nodes of the reservoir. In testing operations, output-processing components may perform operations on the output signals such that the output of the output layer 130 may be a weighted sum of the states of the $N_{out}$ output nodes.

Digital weighting of the output of output layer 130 can be performed by any combination of circuitry suitable to split the output signals from the $N_t$ output nodes into groups having M bits, according to embodiments of this disclosure. For example, if there are $N_{out}$ output nodes, the total output from output layer 130 can be split to $N_{out}/M$ groups. As shown for example in FIG. 14, the output signal from output nodes 1430 may be a 512 bit output signal. Each bit of the 512 bit output signal may correspond to a respective node of the $N_{out}$ output nodes of total nodes 121 in the reservoir of internal network 120. When divided as shown into M=8 bit groups, the output signal from output nodes 1430 can be divided into 64 groups of 8 bit signals. The channels of each of the M bit groups may be coupled to a respective memory unit 1410.

In embodiments of this disclosure, a node state of a particular node may be a binary output of the particular node at a particular time, and a node state of a group of particular nodes may be a combination of the binary outputs of each particular node in the group at a particular time. Accordingly, a node state can include a pattern of the combined outputs of each node in a set of nodes, and the node state of a M bit group can be any of $2^M$ possible node states.

According to embodiments of this disclosure, before testing, output weights for each of the $N_{out}$ output nodes can be calculated by implementing training procedures discussed herein and otherwise in accordance with implementations of this disclosure. A calculated weight may be applied to the signal of a particular node of the $N_{out}$ output nodes in accordance with the node state of the particular node. Similarly, a calculated weight may be applied to the signals of each node in an M bit group of nodes in accordance with the node state for the M bit group of nodes. The group of calculated weights applied to a particular M bit group of nodes based on the particular node state for that M bit group of nodes can be summed into a particular weighted sum. In implementations of this disclosure, the particular weighted sum for that particular node state can be stored in a memory unit 1410, and the particular node state can be linked or otherwise associated with the particular summed weight and stored in the memory unit 1410. In embodiments of this disclosure, $2^M$ distinct summed weights can be calculated for an M bit group of nodes and stored in a memory unit 1410.

In implementations of this disclosure, the particular node state for a particular set of nodes can function as an address for a particular weighted sum, and the particular weighted sum can be selected based on the particular node state. For example, in embodiments of this disclosure, the weighting component 1400 can read the node state of a particular M bit group and call from memory unit 1410 the weighted sum that corresponds to the node state. Weighting component 1400 can then apply the weighted sum to the output signals of the M bit group and provide the weighted sum output signal to summing unit 1420. In implementations of this disclosure where device 100 is performing training operations, a weighted sum for a node state may be set to the node state itself. Setting the weighted sum to the node state can result in weighting component 1400 performing an identity function and passing the signals from the respective M bit group of nodes unweighted.

Summing unit 1420 can combine the weighted sum output signals from each of the M bit groups to produce a device output signal $y_n(t)$ according to embodiments of this disclosure. For example, as shown in FIG. 14, weighting component 1400 can divide the 512 bit output signal from output nodes 1430 into 64 groups of 8 bit signals. Weighting unit 1400 can apply weighted sums to each of the 648 bit signals, and provide each of the 64 weighted sum 8 bit signals to summing unit 1420. Summing unit 1420 can process the 64 weighted sum 8 bit signals to produce output signal $y_n(t)$. For example, summing unit 1420 can sum the 64 weighted sum 8 bit signals to produce an output signal $y_n(t)$. The output signal $y_n(t)$ may be provided to output channels of output layer 130. The output-processing components such as shown in FIG. 14 may be included in any embodiment of this disclosure suitable for their inclusion, such as those that perform digital output weighting and summing.

Figure 15:
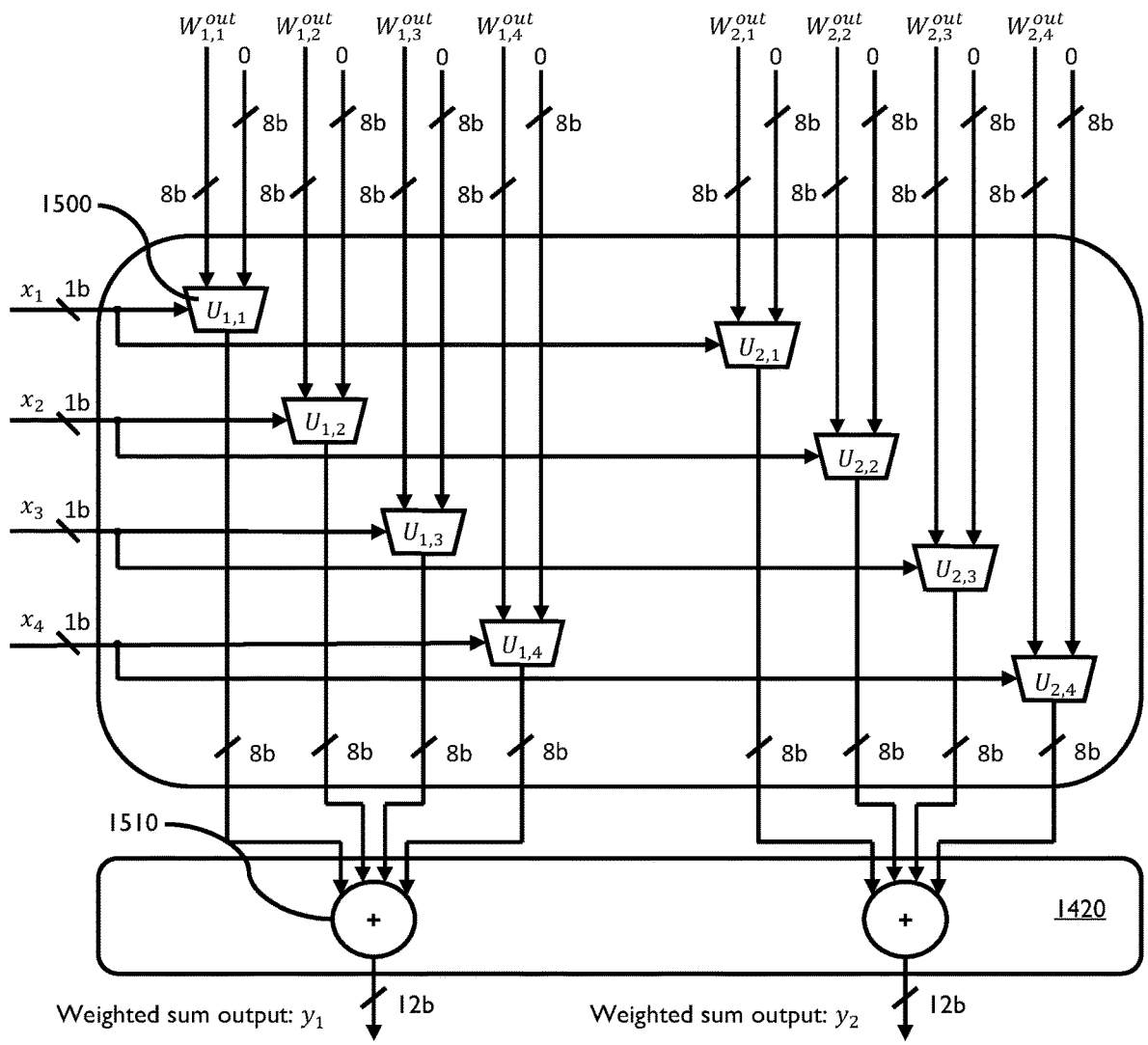
FIG. 15 shows a block diagram of example digital output weighting and summing according to embodiments of this disclosure.

Embodiments of this disclosure may implement any combination of circuitry for performing digital signal weighting and summing suitable for the purposes of this disclosure. For example, digital output signals from output nodes 1430 may be weighted by direct multiplication. FIG. 15 shows a block diagram of example digital output weighting and summing according to embodiments of this disclosure. Output-processing components for digital weighting and summing may include multiplexers (MUXs) 1500, summing unit 1420, and digital summer 1510. Output signals from output nodes 1430 carrying binary output signals, $x_1$, $x_2$, $x_3$, $x_4$, of each output node of internal network 120 can be coupled via output processing channels to select lines of Q number of MUXs to produce Q digital output signals. In some implementations, each MUX can select between two input signals, a digital zero and a digital number representing the weight on the respective node for the corresponding output channel. The output of a node indexed i, may be interconnected to the select line of Q number of MUXs indexed $U_{i,n}$, where n=1, . . . , Q. In implementations of this disclosure, the MUX's output may be one of two inputs: If the $x_i$=0 (binary zero), the output is a multi-bit binary zero. If $x_i$=1 (binary 1), the output of the MUX can be a multi-bit weight $W_{i,n}^{out}$ that can be set by circuitry such as control unit 320 during training of device 100. The outputs of all the MUXs $U_{i,n}$ for i=1, . . . , $N_{out}$ can be added by a parallel digital summing unit 1420 to produce the output signal $y_n(t)$. Output-processing components may provide the output signal $y_n(t)$ to output channels of output layer 130. In some embodiments of this disclosure, operations performed by components depicted in FIG. 15 can be controlled or performed partially or entirely by circuitry of device 100, such as control unit 320. The output-processing components such as shown in FIG. 15 may be included in any embodiment of this disclosure suitable for their inclusion, such as those that perform digital output weighting and summing.

Figure 16:
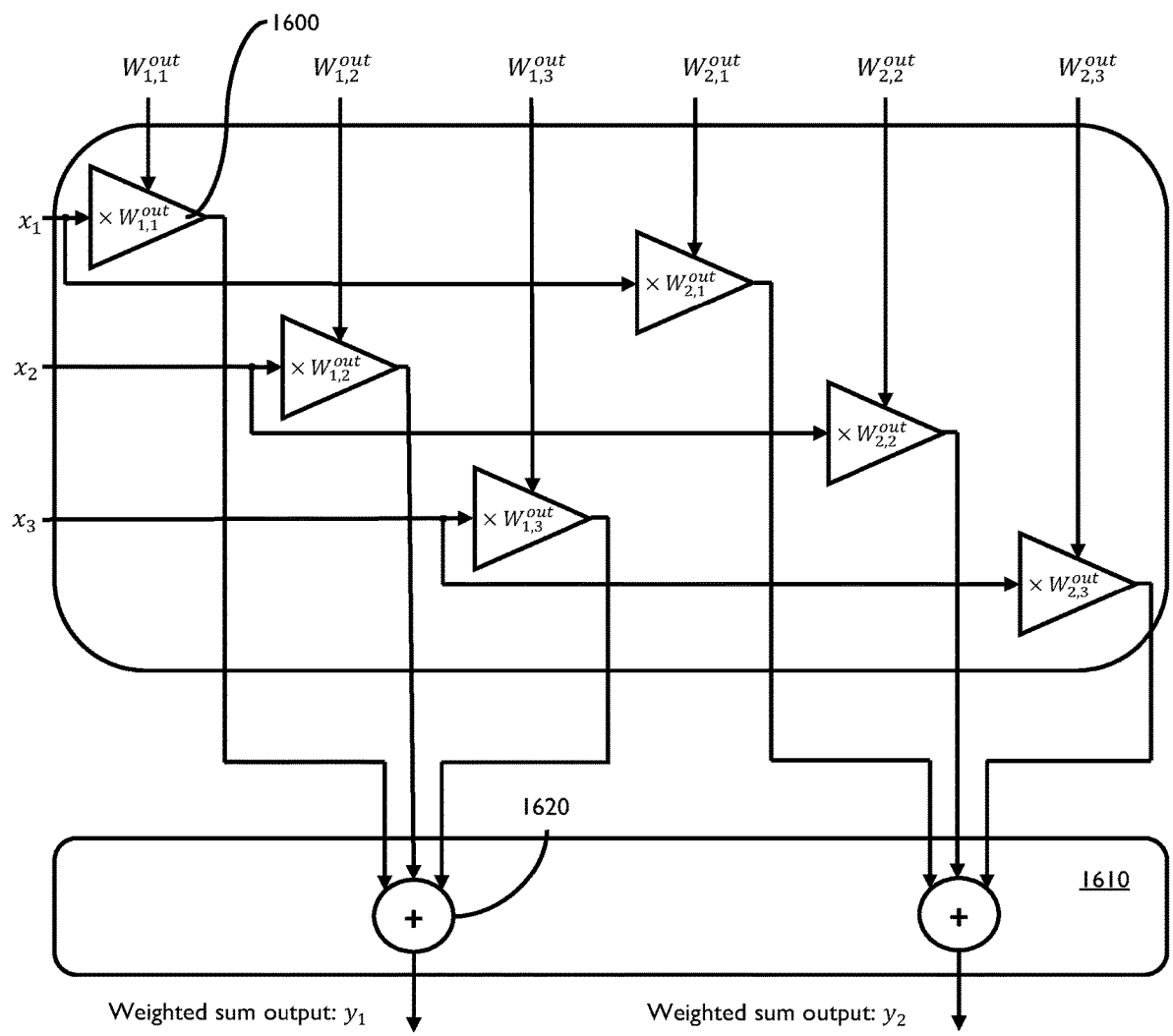
FIG. 16 shows a block diagram of example analog output weighting and summing according to embodiments of this disclosure.

Embodiments of this disclosure may implement any combination of circuitry for performing analog signal weighting and summing suitable for the purposes of this disclosure. For example, output-processing components such as weighing units may weight analog output signals from output nodes of a reservoir by direct multiplication. FIG. 16 shows a block diagram of example analog output weighting and summing according to embodiments of this disclosure. In embodiments of this disclosure, a device, such as device 100, may include a set of analog amplifiers, such as amplifiers 1600, each of which may be coupled to a subset of one or more nodes of the set of nodes that make up the reservoir of the device's internal network, such as output nodes of internal network 120. Each of the analog amplifiers may operate to weight an analog signal output from the subset of nodes. The device may include a DAC, such as DAC 1610 and an analog summing unit, such as analog summing unit 1620. The analog summing unit may be coupled to two or more analog amplifiers of the set of analog amplifiers. The analog summing unit may operate to sum weighted output signals from the two or more analog amplifiers and output the summed weighted output signal to channels of output layer 130.

As further discussion of FIG. 16, according to embodiments of this disclosure $N_{out}$ analog output signals, $x_1$, $x_2$, $x_3$, of $N_{out}$ output nodes in internal network 120 can be coupled via output processing channels to a set of $N_{out}$ analog amplifiers 1600 to produce analog output signal $y_q(t)$ (q=1, 2, . . . , Q). The amplifiers 1600 may index q, n and multiply the output signal $x_n$ by $W_{q,n}^{out}$. There can be Q×$N_{out}$ output amplifiers 1600 used to produce all Q output channels in $\vec{y}(t)$. The amplifiers 1600 can be programed via a DAC 1610 to offset and amplify the signals they receive. In some embodiments of this disclosure, operations performed by components depicted in FIG. 16 can be controlled or performed partially or entirely by circuitry of device 100, such as control unit 320. The gains applied by analog amplifiers 1600 can be determined during the training of the device 100 as explained further below. The output-processing components such as shown in FIG. 16 may be included in any embodiment of this disclosure suitable for their inclusion, such as those that perform analog output weighting and summing.

Signals can propagate among nodes in internal network 120 in an unclocked and asynchronous manner, according to embodiments of this disclosure. In some embodiments, logic gates and other integrated circuitry of each node 121 in internal network 120 may be configured to perform Boolean logic operations on voltage levels that correspond only to the Boolean "0" or "1". In embodiments of this disclosure, internal network 120 may lack registers and clocks and such electric voltage can take a continuous range of values between those that correspond to Boolean "0" and "1" exclusively. Thus, in embodiments of this disclosure, each node 121 can perform a non-linear operation on continuous levels of input values to such node 121. The non-linear operation of such node 121 may not be digitally calculated and instead may be an analog operation on the input voltage levels. The transitional voltages and continuous timing of transitions can carry useful information in this process.

The input layer 110 and/or input weighting components of device 1100 may be clocked, according to embodiments of this disclosure. The input values of input signals $u_{k,n}$ (k=1 . . . K, n=1 . . . $N_{in}$) that are passed to the internal network 120 may change once every clock cycle. The output layer 130 and/or output weighting components may be clocked and the outputs $x_1$ are readout, for example, once every clock cycle. This can be the case if the output layer is digital or analog.

The input layer 110, output layer 130, input-processing components, and/or output-processing components can share the same clock or can have two or more independent clocks according to embodiments of this disclosure. In embodiments having two clocks, relative frequencies of the two clocks and the relative phase between them may be variables of design of the operation of device 100 and may be optimized for different tasks. For example, a phase difference between two equal period clocks at the input layer 110 and output layer 130 can be used to control the timing of readout from the internal network 120 to the output layer 130.

Figure 17:
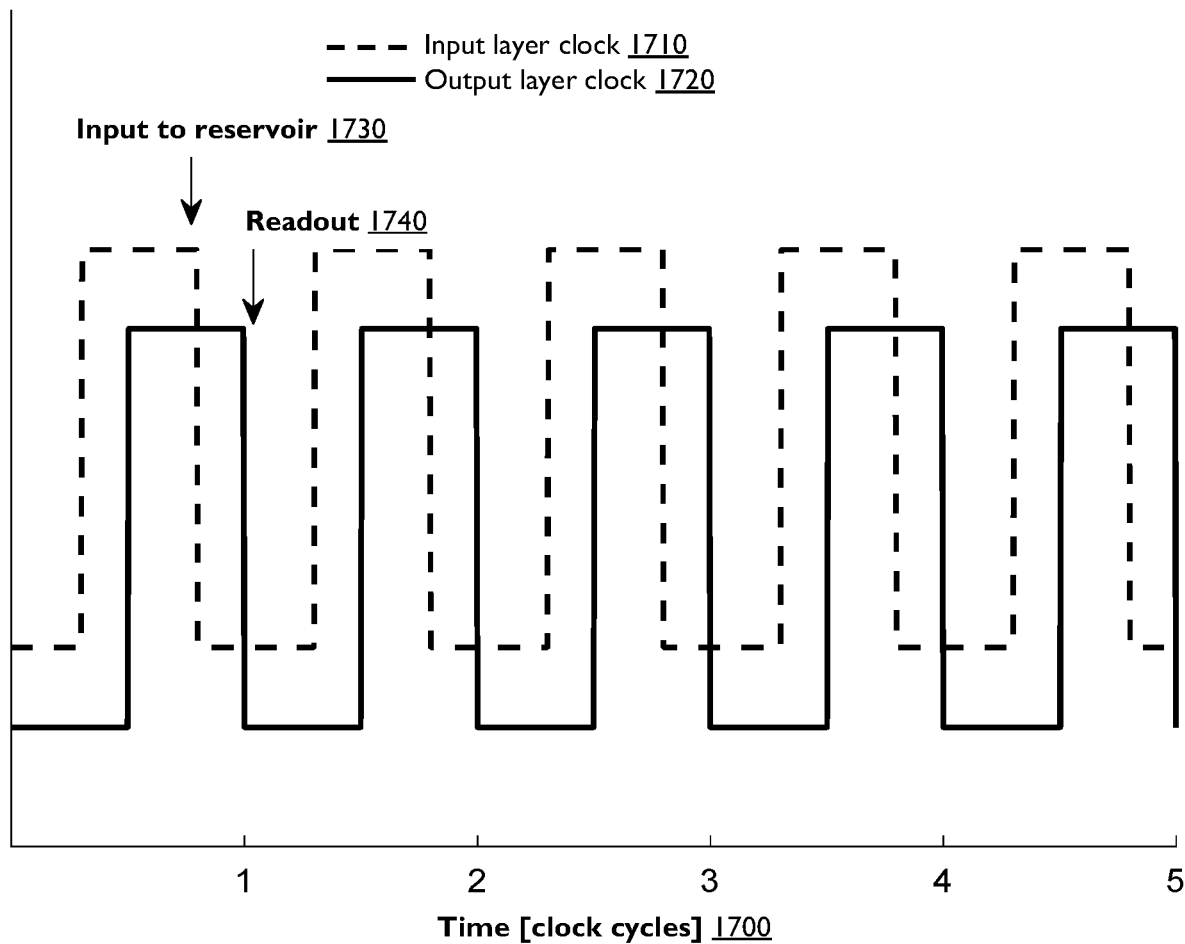
FIG. 17 shows a timing diagram of example process timing for a device for reservoir computing according to embodiments of this disclosure.

Embodiments of this disclosure may implement any combination of circuitry for performing clock operations suitable for the purposes of this disclosure. For example, device 100 may include circuitry for a first clock coupled to input layer 110 and a second clock coupled to output layer 130, such as additional elements 240 referenced in FIG. 2. FIG. 17 shows a timing diagram of example process timing for a device for reservoir computing according to embodiments of this disclosure. Device 100 may have clock frequencies 1700 and include an input layer clock 1710 and output layer clock 1720 both having the same clock frequency. The phase of input layer clock 1710 may be offset from the phase of output layer clock 1720. In implementations of this disclosure, input layer clock 1710 can be configured to trigger when input signals enter the reservoir of internal network 120 at 1730, and output layer clock 1720 can be configured to trigger when output signals leave the reservoir at 1740. For example, the input layer may include a set of input channels and read a set of input values from the set of input channels at a clock frequency of the input layer clock, such as clock frequency 1700. The output layer may include a set of output channels and may be coupled to a subset of the set of nodes in the reservoir of device 100, such as output nodes. The output layer can read a set of output values from the subset of nodes at a clock frequency of the output layer clock, which may be substantially offset from the input layer clock frequency.

In another example in accordance with embodiments of this disclosure, in a task such as image classification, in each clock cycle, each value u of an input signal provided by input layer 110 may represent new source data, such as a new image. Once a new image has been loaded to the input layer 110, the internal network 120 can begin to asynchronously process the image input signal, and the node states in the internal network 120 may continuously change. The clock frequency of the input layer clock 1710, if implemented for example in an FPGA, may be limited due to practical limitations to certain frequencies, for example to 200 megahertz (MHz). The typical rate of transitions in the internal network 120 may be, for example, about 5 gigahertz (GHz), and may be limited only by the transition times of the underlying transistor circuitry implementing internal network 120. The frequency of the output layer clock 1720 may also be limited, for example, to 200 MHz, but may include a relative delay of a selected time, such as 1 nanosecond (ns) relative to the input layer clock 1710. As a result of the relative delay, the node states can be readout at the selected time after the input time, for example 1 ns or 5 transition times of the internal network. If, for example, there was only a single 200 Mhz clock shared by input layer 110 and output layer 130, the node states may only have been readout integer multiples of 5 ns after the input time. The delay between the input layer clock 1710 and output layer clock 1720 can be a parameter of device 100 that can be tuned to optimize the classification accuracy for a given task. In some implementations, multiple clocking can give the device 100 substantially higher accuracy than singled clocked devices.

Training and Testing

Training operations of device 100, such as supervised training, can determine the output weights $W^{out}$ that minimize the difference between the device 100's output $\vec{y}(t)$ and the desired output $\vec{y}_0(t)$ for the training input data $\vec{u}(t)$, according to implementations of this disclosure. For example, the desired output data may be loaded from host computing device, such as any of the computing devices discussed below with reference to FIG. 22, to memory 310 in integrated circuitry of device 100. Training data $\vec{u}(t)$ may be provided directly or indirectly to internal network 120 by input layer 110, and the resulting output signals $\vec{x}(t)$ from the output nodes of internal network 120 may be read and stored in a memory 310. In implementations of this disclosure, output signals $\vec{x}(t)=(x_1(t), x_2(t), \ldots x_{N_{out}}(t))$ can be an $N_{out}$ dimensional vector, where $x_i(t)$ can be the output of the i'th output node. The output weights $W^{out}$ can be computed by minimizing the error function, such as through the equation, $\in = |W_{ou}\vec{x}(t) - \vec{y}_0(t)|^2$, according to implementations of this disclosure. In implementations of this disclosure having pass through channels, such as pass through channels 760, output signals can include $\vec{x}(t)=(x_1(t), x_2(t), \ldots, x_{N_{out}}(t))$ from the reservoir, $\vec{u}(t)$ directly from pass through channels 760, and/or a signal from a bias node of device 100. The output weights $W^{out}$ can be computed by minimizing the error function on $\vec{x}(t)$, $\vec{u}(t)$, and/or the bias node signal, as well as regularized extensions thereof.

In some implementations, when training device 100 it may be beneficial to read and store the output vector $\vec{x}(t)$ in memory 320 in multiple sequential segments to overcome bandwidth limitations. In such implementations, output-processing components and/or the output layer 130 may perform an identity function on the output signals from output nodes of the reservoir. Output hardware, such as output-processing components and/or output layer 130 may be capable of reading the output signal from one output node of internal network 120 at a time. As a result, the input data u(t) may be fed to the input layer 110 Q times, and each time another node output signal can be read and stored in memory 320. For example, first, $x_1(t)$ can be read, then $x_2(t)$ and so on, until $\vec{x}(t)$ has been fully read. To read the output of one node, at each iteration all the output weights may be set to "0" except for the weight of the signal of the node that is to be read at that iteration. The node to be read's weight may be set to "1." As another example, a switch array, such as switch array 350 with respect to FIG. 3 that is controlled by control unit 320 can be used in training. Each output node's output can be connected to a switch of switch array 320 that can be selected if its signal is transferred on. In some implementations, only one node signal may be transferred at a time. The output signal may be transferred to the control unit 320, which may store the output signal data in memory 310. Once all Q output signals have been registered, $W^{out}$ can be calculated by minimizing the error function, such as through calculation $\in = |\vec{y}(t) - \vec{y}_0(t)|^2$, where $\vec{y}(t) = W^{out}\vec{x}(t)$, according to implementations of this disclosure.

Figure 18:
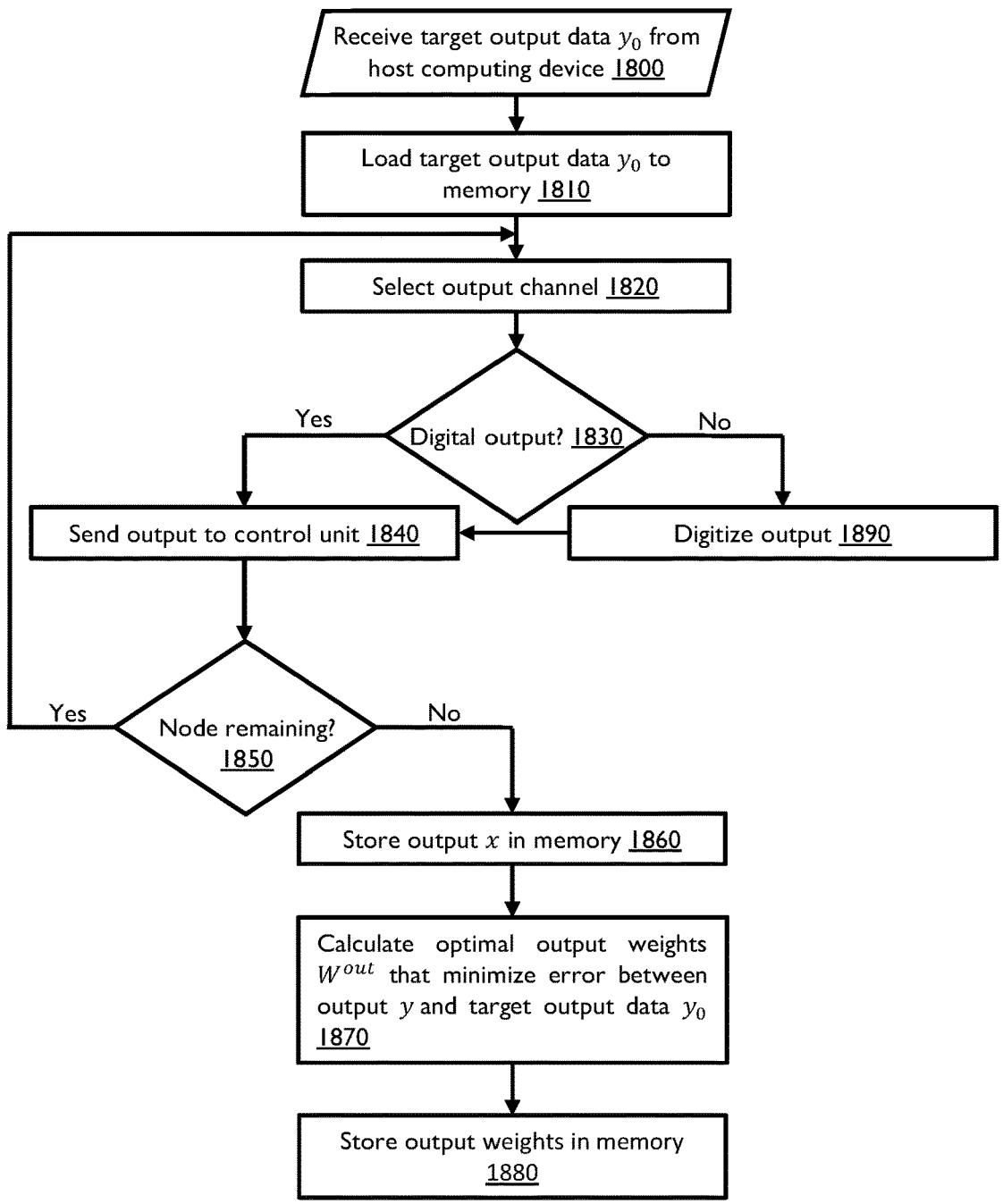
FIG. 18 shows a flow chart of example training operations of a device for reservoir computing according to embodiments of this disclosure.

Implementations of this disclosure may implement any process for training a device implementing a recurrent neural network that is suitable for the purposes of this disclosure. As an example, FIG. 18 shows a flow chart of example training operations of a device for reservoir computing according to embodiments of this disclosure. At 1800 control unit 320 of device 100 can receive target output data from a host computing device in communication with device 100 and load the target output data to memory 310 at 1810.

At 1820, output signals from output nodes of internal network 120 can be received and switch array 350 can select an output channel and transfer the output signals to selector 370. At 1830 if the output signal is analog, it may be digitized by ADC at 1890 before being sent to control unit 320 at 1840. If there are further output signals from output nodes, then, at 1850 the next output signal can be retrieved, otherwise all output signals can be stored in memory 310 at 1860. At 1870 the optimal output weights $W^{out}$ of an output cost function can minimize error between output y and target output data $y_0$.

Figure 19:
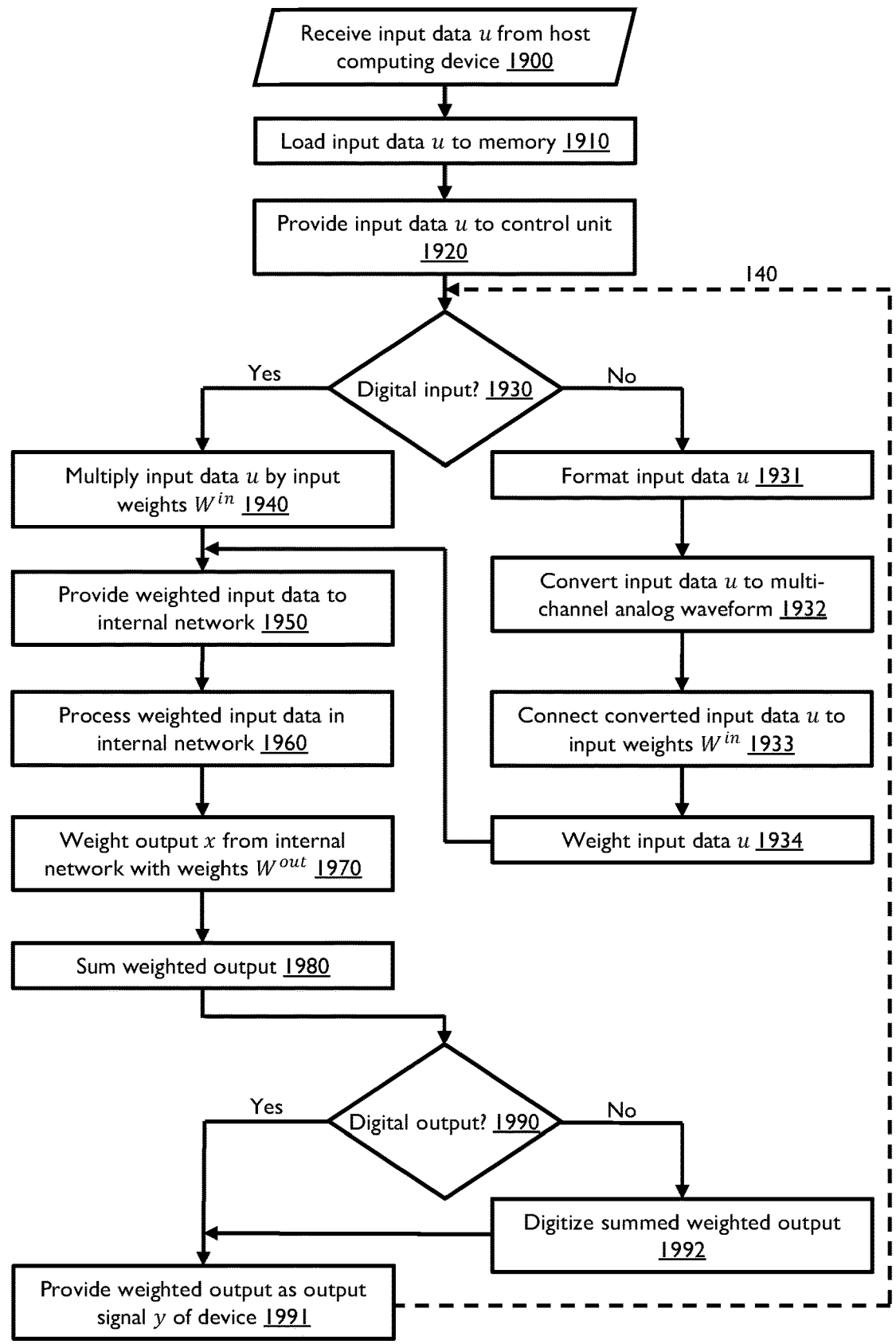
FIG. 19 shows a flow chart of example testing operations of a device for reservoir computing according to embodiments of this disclosure.

Once the reservoir of internal network 120 has been trained, device 100 can perform various machine learning tasks, such as testing operations. Implementations of this disclosure may implement any process for performing testing operations using a recurrent neural network such as a reservoir that is suitable for the purposes of this disclosure. As an example, FIG. 19 shows a flow chart of example testing operations of a device for reservoir computing according to embodiments of this disclosure. At 1900, device 100 may receive input data, for example from a host computing device and load the input data to memory 310 at 1910. At 1920, the input data may be provided to control unit 320. If the input data is determined to be analog data at 1930, the input data may be formatted at 1931 and converted to a multi-channel analog waveform at 1932. At 1933, the circuitry may connect the input data to signal weighting components such as input weighting unit 533. At 1934 the input data may be weighted.

In implementations of this disclosure, if the input data is determined to be digital at 1930, then at 1940 the input data may be multiplied or otherwise weighted by input weighting in accordance with embodiments of this disclosure. At 1950 either the analog or digital input data may be provided to internal network 120 and processed by internal network 120 at 1960. At 1970 the analog or digital output data from internal network 120 may be weighted and summed at 1980 by output-processing components. If at 1990 the output data is determined to be analog then it may be digitized at 1992 by for example, an ADC. At 1991 device 100 may provide the output data as the output signal $\vec{y}$ of device 100.

Feedback can be beneficial for some operations of device 100, such as prediction or mimicking tasks, and embodiments of this disclosure may include feedback circuitry, such as feedback line 140 shown in FIGS. 1 and 19. Implementations of this disclosure may include any process involving feedback operations that is suitable for the purposes of this disclosure. In an implementation, the output signal $\vec{y}(t)$ of device 100 may be sent back to the input layer 110 of device 100 to create feedback within internal network 120. For example, a predicted target output signal Mt) can be provided over feedback line 140 to input layer 110 as input data $\vec{u}(t+\Delta t)$. The feedback loop can be implemented in a variety of techniques. In embodiments of device 100 having digital inputs and digital output signals, the digital output signals can be sent to the control unit 320, and control unit 320 can provide the feedback to the input layer 110 of device 100. In digital input and analog output embodiments, analog output signals can be digitized by an ADC and then can be sent to the control unit 320, which may send the feedback to input layer 110. In embodiments having analog inputs and outputs, if the input nodes of internal network 120 accept analog inputs and the output nodes of internal network 120 provide analog outputs, the output of the internal network 120 can be sent directly to the input layer 110, such as through a switch. In embodiments having analog inputs and digital outputs, the output signal can be sent to the control unit 320, converted by a DAC to an analog signal, and sent to input layer 110 of device 100.

Figure 20:
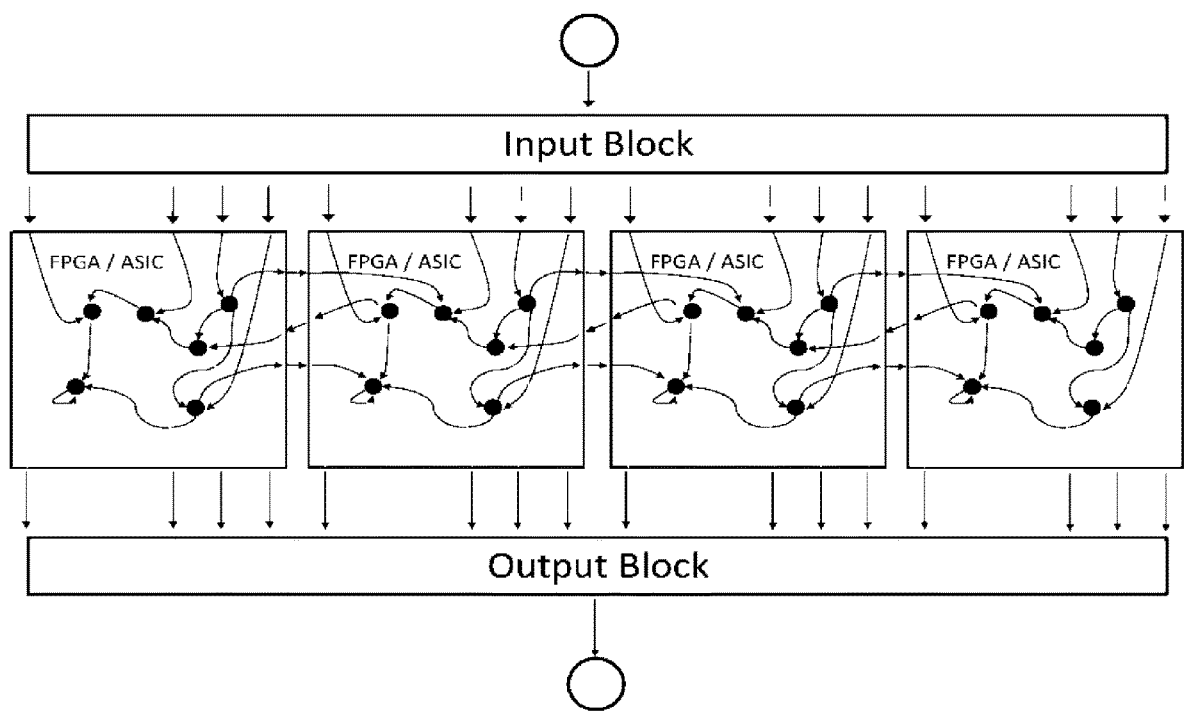
FIG. 20 shows a block diagram of an example parallel arrangement for a device for reservoir computing according to embodiments of this disclosure.
Figure 21:
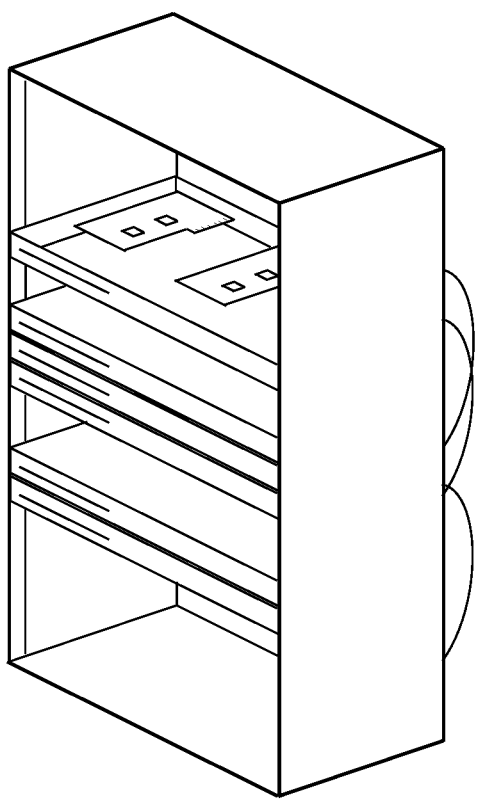
FIG. 21 shows an illustration of an example rack for housing a device for reservoir computing according to embodiments of this disclosure.

In embodiments of this disclosure, parallelizing of multiple devices 100 can be accomplished for example by directed interconnections between the integrated circuitry that implements the reservoirs of internal networks 120 of devices 100. The resulting hardware may be a larger device for reservoir computing that is capable of handling complex tasks. In such embodiments, a larger adjacency matrix can describe the resulting larger internal network 120. Large adjacency matrices for reservoir designs can be transformed by permutation to a block-diagonal matrix and a sparse additional connection matrix. These matrixes may be employed, for example, to wire multiple parallel integrated circuits such as FPGA's or ASIC's into graphs that exceed the number of nodes or logic gates in a single such integrated circuit. Parallelization of device 100 may allow substantially unlimited upward scalability of embodiments of this disclosure. FIG. 20 shows a block diagram of an example parallel arrangement for a device for reservoir computing according to embodiments of this disclosure, and FIG. 21 shows an illustration of an example rack for housing a one or more devices for reservoir computing according to embodiments of this disclosure. The rack depicted in FIG. 21 may be used, for example, for housing two or more parallelized devices 100. Parallel devices can also be used for joint training of the output layer and other parameters, as well as training in accordance with ensemble learning methods.

Additional processing of the output signals of device 100 may be beneficial for certain machine learning tasks. According to implementations of this disclosure the output of the reservoir 120 of device 100 can be passed as input to a machine learning system implementing an artificial neural network, such as a feed forward neural network (FFNN). Implementations of this disclosure providing for machine learning processing of the output of device 100 can include implementations of any machine learning system suitable for the purposes of this disclosure. For example, in implementations of this disclosure, a machine learning system that is in communication with a set of weighting units of device 100, such as weighting units 1400, can processes an output signal generated by each of the set of weighting units. The machine learning system can be implemented on any combination of hardware and/or software suitable for the purposes of this disclosure. For example, the machine learning system may be implemented on computing devices such as any of the computing devices described below with respect to FIG. 22 and in communication with device 100 directly or indirectly, such as in accordance with any suitable components of the network arrangement depicted in FIG. 23. In embodiments of this disclosure, the machine learning system may implement an artificial neural network, a deep learning artificial neural network, a support vector machine, a Bayesian network, and/or a clustering analysis system. According to implementations of this disclosure, a machine learning system may perform processing on the output of reservoir of a device, such as device 100, to execute operations such as classification, prediction, and control based on the processed output signal from each of the set of weighting units of the device.

The output of a machine learning system that takes inputs from the output signal of device 100 can be a combined system output, according to implementations of this disclosure. The addition of machine learning may achieve greater accuracy in prediction, classification, or mimicking relative to a certain types of reservoir computers alone, such as those with a linear output, or a single activated layer. In embodiments of this disclosure, a machine learning system, such as a FFNN can be implemented, for example, within the FPGA or ASIC of the reservoir, in a different FPGA or ASIC, or in software as a post processing step. In embodiments implementing a FFNN, the FFNN's input layer may be the output nodes of the reservoir itself. The FFNN may have multiple hidden layers and may have an output layer with a number of nodes as may be required by a given task, or otherwise as is suitable for the purposes of this disclosure. The FFNN can be trained by the same supervisory host computing device as that of a reservoir with a linear output, or by one or more other computing devices suitable for the purposes of this disclosure.

In embodiments of this disclosure, all of the auxiliary hardware can be monolithic as an auxiliary chipset to the reservoir integrated circuitry, such as an FPGA or ASIC, or monolithic together with the reservoir integrated circuitry. Signal amplifiers discussed herein may be any combination of circuitry suitable for the purposes of this disclosure. For example, amplifiers may be CMOS field-effect transistor amplifiers. In addition to amplifiers, weighting of input and output signals be done by the number of copies of input data sent to input nodes, or respectively the number of copies of output data to output nodes as needed, or in accordance with other techniques suitable for the purposes of this disclosure. In some implementations, the entire device 100 can be described by hardware description language that may be used to create the integrated circuitry of the device 100, including to configure an FPGA or fabricate the ASIC.

Other Components

Implementations of this disclosure can be implemented in and used with a variety of components and network architectures. FIG. 22 is an example computing device 2200 according to implementations of this disclosure. Computing devices, such as computing device 2200, can include computers, servers, mainframes, desktops, laptops, tablets, smart phones, wearable devices, and other data processing devices. Computing device 2200 can include a bus 2210 that interconnections major components of the computing device 2200. Major components can include: central processing unit (CPU) 2220 (which can include a processor that includes circuitry for arithmetic logic units, control units, and/or processor registers); memory 2230 (which can include RAM, read-only memory (ROM), flash RAM, or other volatile or non-volatile memory components); input/output controller 2240; user display 2250 (which can include a display screen via a display adapter); user input interface 2260 (which can include one or more controllers and associated user input devices such as a keyboard, mouse, touch screen, microphone, or camera, and can be closely coupled to the input/output controller 2240); fixed storage 2270 (which can include, a hard drive, flash storage, Fibre Channel device, storage area network device, advanced technology attachment (ATA) device, serial ATA device, small computer system interface (SCSI) device, serial attached SCSI device, or other non-volatile physical storage device); removable media component 2280 operative to receive and control an optical disk, flash drive, or other removable media, and network interface 2290.

Bus 2210 allows data communication between the CPU 2220 and the memory 2230, which can include ROM or flash memory (neither shown), and RAM, as previously noted. RAM is generally the main memory into which the operating system and application programs are loaded. The RAM, ROM or flash memory can contain, among other code, boot-up instructions and the basic input/output system which controls basic hardware operation such as the interaction with peripheral components. Applications resident with the computing device 2200 are generally stored on and accessed via a computer-readable medium, such as a fixed storage 2270 or removable media 2280.

Many other devices or components can be connected to computing device 2200 or other integrated circuitry described in this disclosure in a similar manner (e.g., imaging devices, biometric devices, actuators, sensors, document scanners, digital cameras, virtual reality devices, and other devices that interact with computing devices and integrated circuitry). Conversely, all of the components shown in FIG. 22 need not be present to practice implementations of this disclosure. The components of FIG. 22 can be interconnected in different ways from that shown. Code or instructions for operation of implementations of this disclosure can be stored in computer-readable storage media such as one or more of memory 2230, fixed storage 2270, and removable media 2280 that are local or integrated with computing device 2200 or located remote from computing device 2200.

Network interface 2290 may provide a direct connection to a remote server via a telephone link, the Internet via an internet service provider, or a direct connection to a remote server via a direct network link to the Internet via a point of presence or other network connection technique. The network interface 2290 may provide such connection using wireless techniques, including near field communication connections, Bluetooth connections, digital cellular telephone connections, cellular digital packet data connections, digital satellite data connections, or other communication techniques. For example, the network interface 2290 may allow computing device 2200 to communicate with other computing devices via one or more networks as shown in FIG. 23.

Figure 23:
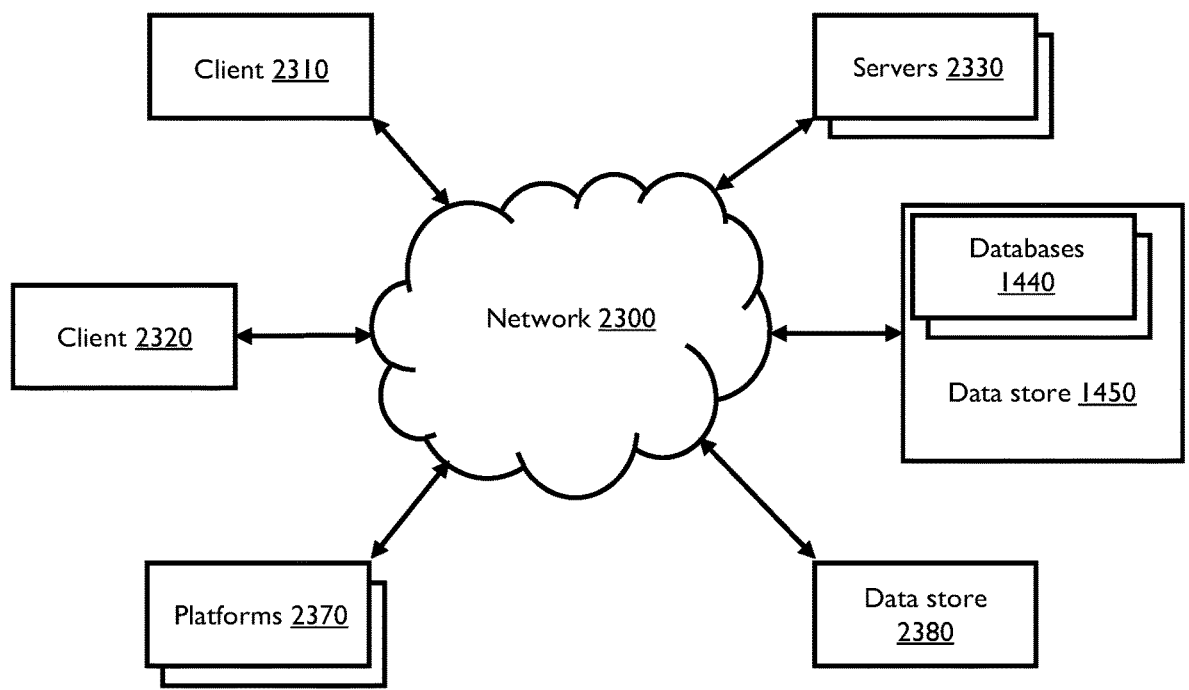
FIG. 23 shows an example network arrangement according to embodiments of this disclosure.

FIG. 23 shows an example network arrangement according to implementations of this disclosure. One or more clients 2310, 2320, such as local computing devices, smart phones, tablet computing devices, wearable devices, or other client devices can connect to other devices via one or more networks 2300. Network 2300 can be wired or wireless and can be a personal-area network, local-area network, passive optical local area network, mesh network, campus area network, metropolitan area network, wide-area network, storage-area network, system-area network, enterprise private network, virtual private network, the Internet, or any other communication network or networks suitable for the purposes of this disclosure. Clients 2310, 2320 can communicate with one or more servers 2330 and databases 2340. Network devices and services can be directly accessible by clients 2310, 2320, or one or more other network components may provide intermediary access such as where one or more servers 2330 manage access by clients, 2310, 2320 to resources stored in one or more databases 2340. Database 2340 can be implemented on a data store 2350, whereas data store 2360 can store data in a non-database format. A data store can be any combination of hardware and software suitable for storing structured and/or unstructured data. Clients 2310, 2320 also may access one or more remote platforms 2370 or services provided by remote platforms 2370 such as infrastructure as a service, platform as a service, software as a service, and backend as a service. Remote platforms 2370 may include one or more servers and/or databases.

In general, various implementations of this disclosure can include computer-implemented procedures or processes and apparatuses for practicing those procedures or processes.

Implementations of this disclosure can also be implemented in the form of a computer program product having program code or instructions encoded thereon. Program code or instructions can be stored in non-transitory, computer-readable media, such as floppy diskettes, optical disks, hard drives, universal serial bus drives, or any other machine readable storage medium. When the program code or instructions are loaded into and executed by a computing device, the computing device becomes an apparatus for practicing implementations of this disclosure. In addition, program code or instructions can be stored in a remote storage medium and transmitted over a transmission medium, such as electrical wiring, cabling, or fiber optics, or via electromagnetic radiation to a computing device, and when the program code or instructions are loaded into and executed by the computing device, the computing device becomes an apparatus for practicing implementations of this disclosure.

According to implementations of this disclosure, when program code or instructions are executed on one or more general-purpose processors (such as on one or more CPUs, microprocessors, or other general-purpose integrated circuits having one or more processing cores) segments of the program code or instructions can configure the one or more general-purpose processors to create specific logic circuits. In some implementations, program code or instructions stored on a computer-readable storage medium can be executed by a general-purpose processor, which can transform the general-purpose processor or a device containing the general-purpose processor into a special-purpose device configured to implement or carry out the computer code or instructions.

All or part of implementations of this disclosure can be embodied in hardware and/or firmware that include integrated circuits such as microprocessors, digital signal processors, microcontrollers, ASICs, FPGAs, graphics processing units, systems on a chip, three dimensional integrated circuits, programmable array logic, programmable logic arrays, field programmable logic arrays, electrically programmable logic devices, electrically erasable programmable logic devices, logic cell arrays, application specific standard products, or any other integrated circuitry suitable for the purposes of this disclosure.

The devices described herein may be part of a data processing system that includes one or more of a processor, memory, input/output circuitry, and peripheral devices. The data processing system can be used in a wide variety of applications, such as computer networking, data networking, instrumentation, video processing, digital signal processing, or any other application suitable for the purposes of this disclosure. The devices described herein can be used to perform a variety of different logic functions in conjunction with such data processing systems. For example, the devices disclosed herein can be configured as a processor or controller that works in cooperation with a processor of the data processing system. The device may also be used as an arbiter for arbitrating access to a shared resource in the data processing system. In another example, the device can be configured as an interface between a processor and one of the other components in the data processing system.

Although the operations described in this disclosure may be described in a specific order, other operations may be performed in between described operations. Operations described herein may also be adjusted so that they occur at different times or described operations may be distributed in a system which allows the occurrence of the processing operations at various intervals associated with the processing, as long as the processing of the overlay operations are performed in a desired way.

For the purposes of this disclosure, unless expressly stated otherwise: (a) the use of singular forms of terms include plural forms; (b) the use of the terms "including," "having," and similar terms are deemed to have the same meaning as "comprising" and thus should not be understood as limiting; (c) the term "set" or "subset" means a collection of one or more than one elements; (d) the term "plurality" means a collection of two or more elements; (e) the term "such as" means for example; (f) the term "and/or" means any combination or sub-combination of a set of stated possibilities, for example, "A, B, and/or C," means any of: "A," "B," "C," "AB," "AC," or "ABC;" and (g) headings, numbering, bullets, or other structuring of the text of this disclosure is not to be understood to limit or otherwise affect the meaning of the contents of this disclosure.

The foregoing disclosure, for purpose of explanation, has been described with reference to specific implementations. The illustrative discussions above are not intended to be exhaustive or to limit implementations of the disclosure to the precise forms disclosed. Many modifications and variations are possible in view of the teachings of this disclosure. The implementations were chosen and described in order to explain the principles of implementations of the disclosure and their practical applications, and to thereby enable others skilled in the art to utilize those implementations as well as various implementations with various modifications as may be suited to the particular use contemplated.

The invention claimed is:

1. A device, comprising:
a set of input channels;
a set of output channels;
a plurality of reservoir nodes, the plurality of reservoir nodes including a first set of input nodes coupled to the set of input channels, and a second set of variable-weight output nodes coupled to the set of output channels, each reservoir node in the of the plurality of reservoir nodes comprising a component configured to perform a non-linear operation on a respective set of input signals and output a set of output signals, the second set of variable weight output nodes each being configured to input an analog input signal and provide an analog output signal;
a set of interconnections, each of which couples together two or more of the reservoir nodes; and
a set of weighting units, each of which is coupled to at least one variable-weight output node in the second set of output nodes and configured for weighting the output signals therefrom with a continuously variable weighting signal based on a present node state of the at least one variable weight output node.

2. The device of claim 1, further comprising a summing unit coupled to the set of weighting units and configured to output a sum of the weighted output signals of the set of weighting units.

3. The device of claim 1, wherein a total number of the second set of nodes is less than a total number of the first set of nodes.

4. The device of claim 1, wherein:
each weighting unit is configured to weight the output signals from the second set of output nodes as a function of node state of second set of nodes.

5. The device of claim 1, wherein the node state comprises a pattern of the combined outputs of each reservoir node of the second set of output nodes.

6. The device of claim 1, wherein each reservoir node is configured for weighting the output signals by a binary weight derived from said continuously variable weighting signal.

7. The device of claim 1, wherein:
the set of input channels comprises a set of parallel input channels, and
the set of input channels carries a signal comprising at least one selected from the group consisting of an analog signal and a digital signal.

8. The device of claim 1, further comprising:
an input layer that comprises the set of input channels and reads a set of input values from the set of input channels to the first set of input nodes at a first clock frequency; and
an output layer that comprises the set of output channels and reads a set of output values to the second set of output nodes at a second clock frequency that is offset from the first clock frequency.

9. The device of claim 1, further comprising:
a machine learning system that is in communication with the set of weighting units, the machine learning system configured to process an output signal generated by each of the set of weighting units, and perform at least one operation selected from the group of operations consisting of classification, prediction, and control based on the processed output signal from each of the set of weighting units,
wherein the machine learning system comprises at least one selected from the group consisting of an artificial neural network, a deep learning artificial neural network, a support vector machine, a Bayesian network, a clustering analysis system; and ensemble learning having one or more groups.

10. The device of claim 1, wherein at least one reservoir node of the plurality of reservoir nodes is programmable and is integrated with the set of interconnections in a hardwired, integrated circuit.

11. The device of claim 1, wherein at least one of the second set of variable weight output nodes is programmable to provide a binary weight, and is integrated with the set of interconnections in a hardwired, integrated circuit.

12. The device of claim 1, wherein at least one reservoir node of the plurality of reservoir nodes is programmable and comprises a Boolean logic gate comprising:
an AND gate having an input channel comprising a first interconnection of the set of interconnections, an input channel comprising a control channel that is distinct from the set of interconnections, and an output channel; and
an XOR gate having an input channel comprising a second interconnection of the set of interconnections that is distinct from the first interconnection and an input channel comprising the output channel of the AND gate.

13. The device of claim 1, wherein each reservoir node of the plurality of reservoir nodes is programmable and is integrated with the set of input channels, the set of interconnections, and the set of weighting units in a programmable logic device.

14. The device of claim 1, wherein the set of interconnections is distributed among the plurality of reservoir nodes in accordance with a parametrically random distribution.

15. The device of claim 1, wherein the set of interconnections is distributed among the plurality of reservoir nodes in accordance with an interconnection density of the set of interconnections.

16. The device of claim 1, wherein the set of interconnections is distributed among the plurality of reservoir nodes in accordance a product of an interconnection density of the set of interconnections and a mean sensitivity of each Boolean logic gate in the plurality of reservoir nodes.

17. The device of claim 1, wherein the set of interconnections is distributed among the plurality of reservoir nodes in accordance with a value less than about 0.55 for a product of an interconnection density of the set of interconnections and a mean sensitivity of each Boolean logic gate in the plurality of reservoir nodes.

18. The device of claim 1, wherein at least one of a distribution of the set of interconnections among the plurality of nodes and a type of Boolean logic gate of a node of the plurality of nodes is based on a transient memory time of the device.

19. The device of claim 1, wherein a transfer function characteristic is distributed among the plurality of nodes based on at least one selected from the group consisting of: a transistor characteristic of a Boolean logic gate of at least one node of the plurality of nodes, a power supply voltage provided to a node of the plurality of nodes, and a power supply voltage applied to the plurality of nodes.

20. The device of claim 1, further comprising one or more pass through channels that are coupled to the set of input channels and the set of weighting units, wherein the one or more pass through channels are not coupled to the plurality of nodes and provide a set input signals directly to the set of weighting units.

* * * * *